(12) United States Patent
Kim et al.

(10) Patent No.: US 10,991,714 B2
(45) Date of Patent: Apr. 27, 2021

(54) THREE-DIMENSIONAL SEMICONDUCTOR MEMORY DEVICE

(71) Applicant: Samsung Electronics Co., Ltd., Suwon-si (KR)

(72) Inventors: Kwang Soo Kim, Hwaseong-si (KR); Jun Hyoung Kim, Seoul (KR); Si Wan Kim, Hwaseong-si (KR); Kyoung Taek Oh, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 58 days.

(21) Appl. No.: 16/223,761

(22) Filed: Dec. 18, 2018

(65) Prior Publication Data

US 2019/0378855 A1    Dec. 12, 2019

(30) Foreign Application Priority Data

Jun. 12, 2018  (KR) ........................ 10-2018-0067714

(51) Int. Cl.
| | |
|---|---|
| *H01L 27/11582* | (2017.01) |
| *H01L 27/11565* | (2017.01) |
| *H01L 29/423* | (2006.01) |
| *H01L 27/11573* | (2017.01) |
| *G11C 16/08* | (2006.01) |

(52) U.S. Cl.
CPC .. *H01L 27/11582* (2013.01); *H01L 27/11565* (2013.01); *H01L 27/11573* (2013.01); *H01L 29/4234* (2013.01); *G11C 16/08* (2013.01)

(58) Field of Classification Search
CPC ......... H01L 27/11582; H01L 27/11573; H01L 27/11565; H01L 23/528
See application file for complete search history.

(56) References Cited

U.S. PATENT DOCUMENTS

| | | |
|---|---|---|
| 8,901,745 B2 | 12/2014 | Hwang et al. |
| 9,276,009 B2 | 3/2016 | Chen |
| 9,449,987 B1 | 9/2016 | Miyata et al. |

(Continued)

FOREIGN PATENT DOCUMENTS

| | | |
|---|---|---|
| JP | 2014-192243 A | 10/2014 |
| KR | 10-2009-0130180 A | 12/2009 |

(Continued)

*Primary Examiner* — Tuan A Hoang
(74) *Attorney, Agent, or Firm* — Muir Patent Law, PLLC

(57) ABSTRACT

A three-dimensional semiconductor memory device includes first and second gate stacked structures, disposed on a base substrate, and stacked in a direction perpendicular to a surface of the base plate, the first and second gate stacked structures including gate electrodes spaced apart from each other and stacked; a through region passing through the first and second gate stacked structures and surrounded by the first and second gate stacked structures; and vertical channel structures passing through the first and second gate stacked structures, wherein the first gate stacked structure has first contact pads adjacent to the through region and arranged in a stepped shape, the second gate stacked structure having second contact pads adjacent to the through region and arranged in a stepped shape, at least a portion of the second contact pads overlap the first contact pads on one side of the through region.

20 Claims, 17 Drawing Sheets

(56) References Cited

U.S. PATENT DOCUMENTS

| | | | |
|---|---|---|---|
| 9,786,681 B1 | 10/2017 | Ariyoshi | |
| 10,115,681 B1 * | 10/2018 | Ariyoshi | H01L 27/11524 |
| 10,283,493 B1 * | 5/2019 | Nishida | G11C 16/08 |
| 2010/0052042 A1 | 3/2010 | Tanaka et al. | |
| 2013/0126957 A1 * | 5/2013 | Higashitani | H01L 27/11565 |
| | | | 257/314 |
| 2014/0293700 A1 | 10/2014 | Sakanushi | |
| 2017/0179153 A1 * | 6/2017 | Ogawa | H01L 23/5226 |

FOREIGN PATENT DOCUMENTS

| | | | | |
|---|---|---|---|---|
| KR | 10-1559958 B1 | 6/2011 | | |
| WO | WO-2018161836 A1 * | 9/2018 | | H01L 27/11582 |

* cited by examiner

THREE-DIMENSIONAL SEMICONDUCTOR MEMORY DEVICE

CROSS-REFERENCE TO RELATED APPLICATION

This application claims the benefit of priority to Korean Patent Application No. 10-2018-0067714, filed Jun. 12, 2018, in the Korean Intellectual Property Office, the disclosure of which is incorporated by reference herein in its entirety.

BACKGROUND

1. Field

The present disclosure relates to a semiconductor device, and more particularly, to a three-dimensional semiconductor memory device including a through region passing through a gate stacked structure.

2. Description of Related Art

Semiconductor devices, including gate electrodes stacked in a direction perpendicular to a surface of a semiconductor substrate, have been developed. In order to increase the degree of integration of semiconductor devices, the number of the stacked gate electrodes may be increased. As the degree of integration increases, the number of gate electrodes stacked in a direction perpendicular to the surface of the semiconductor substrate gradually increases, and the number of defects occurring in cases of connecting the gate electrodes to peripheral circuits is increasing.

SUMMARY

An aspect of the present disclosure is to provide a three-dimensional semiconductor memory device.

An aspect of the present disclosure is to provide a three-dimensional semiconductor memory device, advantageous for a high degree of integration.

According to an example embodiment, the disclosure is directed to a three-dimensional semiconductor memory device comprising: first and second gate stacked structures, disposed on a base substrate, and stacked in a direction perpendicular to a surface of the base substrate, the first and second gate stacked structures including first and second gate electrodes, respectively, spaced apart from each other and stacked in the direction perpendicular to the surface of the base substrate; a through region passing through the first and second gate stacked structures and surrounded by the first and second gate stacked structures; and vertical channel structures passing through the first and second gate stacked structures, wherein the first gate stacked structure has first contact pads adjacent to the through region and arranged in a first stepped shape, and the second gate stacked structure has second contact pads adjacent to the through region and arranged in a second stepped shape, and wherein a portion of the second contact pads overlap the first contact pads on one side of the through region, when viewed in a plan view.

According to an example embodiment, the disclosure is directed to a three-dimensional semiconductor memory device comprising: memory cell array regions disposed on a base substrate; first and second inner stepped regions between the memory cell array regions; a bridge region between the first and second inner stepped regions; a gate stacked structure including first and second word lines stacked in the memory cell array regions and extending lengthwise in a first direction to the first and second inner stepped regions; and a through region passing through the gate stacked structure in the bridge region, wherein each of the first and second word lines extend lengthwise from the memory cell array regions and connect in the bridge region, and wherein a length in the first direction of the gate stacked structure disposed in the first inner stepped region is different from a length in the first direction of the gate stacked structure disposed in the second inner stepped region.

According to an example embodiment, the disclosure is directed to a three-dimensional semiconductor memory device comprising: first and second gate stacked structures stacked on a base substrate; and a through region passing through the first and second gate stacked structures and surrounded by the first and second gate stacked structures, wherein the first and second gate stacked structures comprise first and second word lines, respectively, wherein the first word lines of the first gate stacked structure include first contact pads surrounding the through region and disposed in a first stepped shape that lowers toward the through region, and the second word lines of the second gate stacked structure include second contact pads surrounding the through region and disposed in a second stepped shape that lowers toward the through region, and wherein the second contact pads cover a portion of the first contact pads.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
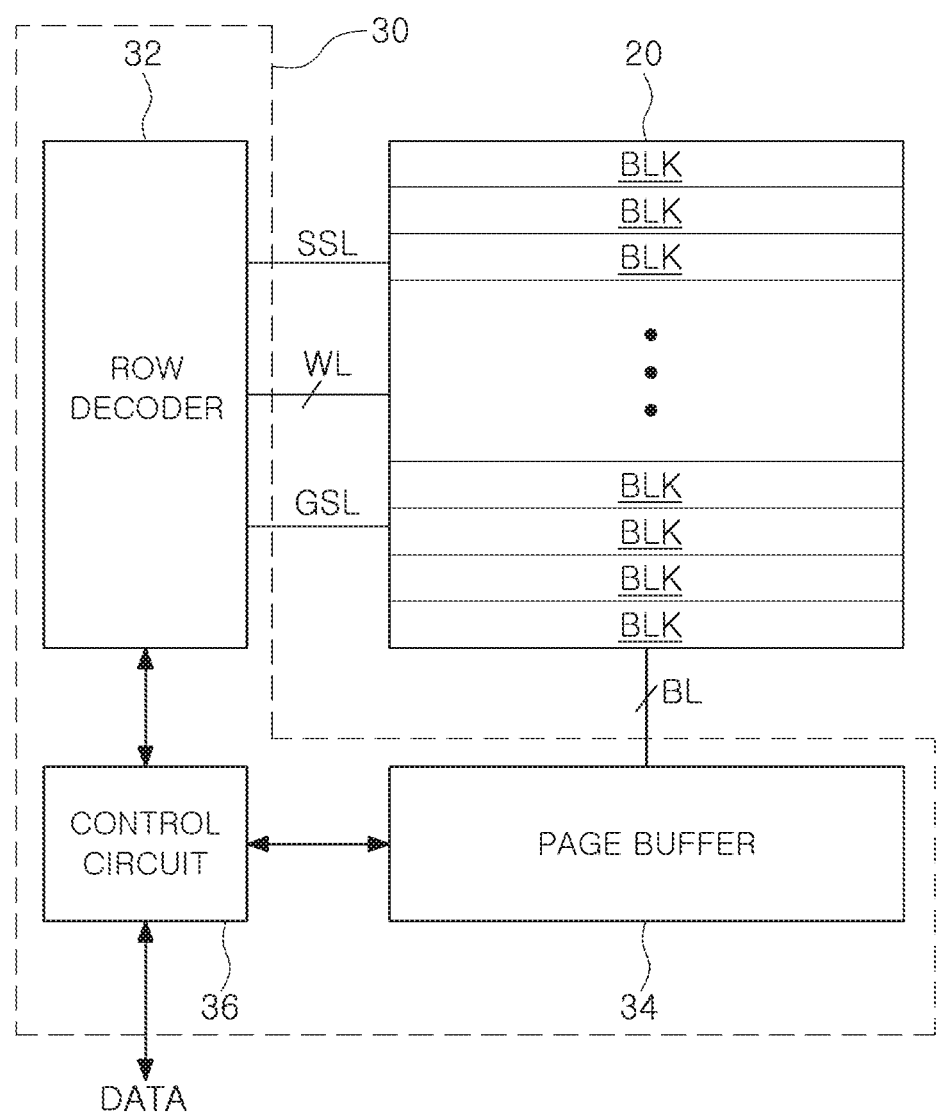
FIG. 1 is a schematic block diagram of a three-dimensional semiconductor memory device, according to an example embodiment.

FIG. 1 is a schematic block diagram of a three-dimensional semiconductor memory device, according to an example embodiment.

Referring to FIG. 1, a three-dimensional semiconductor memory device 10 according to an example embodiment may include a memory cell array region 20 and a control logic region 30. The memory cell array region 20 may include a plurality of memory blocks BLK, and each memory block BLK may include a plurality of memory cells. The control logic region 30 may include a row decoder 32, a page buffer 34, and a control circuit 36.

The plurality of memory cells in the memory cell array region 20 may be connected to the row decoder 32 via a string selection line SSL, a plurality of word lines WL, and a ground selection line GSL, and may be connected to the page buffer 34 via bit lines BL.

The row decoder 32 may decode an input address received from the control circuit 36 to generate and transfer driving signals of the word lines WL. The row decoder 32 may provide a word line voltage generated by a voltage generation circuit in the control circuit 36 to a selected word line selected from the word lines WL and an unselected word line selected from the word lines WL, respectively, in response to controlling by the control circuit 36.

The page buffer 34 may be connected to the memory cell array region 20 via the bit lines BL to read information stored in the memory cells or write information to the memory cells for storage. The page buffer 34 may temporarily store data to be stored in the memory cells or sensed data stored in the memory cells, depending on an operation mode. The page buffer 34 may include a column decoder (not shown) and a sense amplifier (not shown).

The column decoder may selectively activate the bit lines BL of the memory cell array region 20. The sense amplifier may sense a voltage of the bit line BL selected by the column decoder during a reading operation, to read the data stored in the selected memory cell. The control circuit 36 may control operations of the row decoder 32 and the page buffer 34. The control circuit 36 may receive a control signal and an external voltage transferred from an external source (not shown), and may operate according to the received control signal. The control circuit 36 may include a voltage generating circuit generating voltages for internal operations, for example, a programming voltage, a reading voltage, an erasing voltage, etc., using an external voltage. The control circuit 36 may control a reading operation, a writing operation, and/or an erasing operation in response to the control signals. Further, the control circuit 36 may include an input/output circuit. The input/output circuit may receive data DATA in a programming operation, transfer the data to the page buffer 34, and output the data DATA received from the page buffer 34 in a reading operation.

Figure 2:
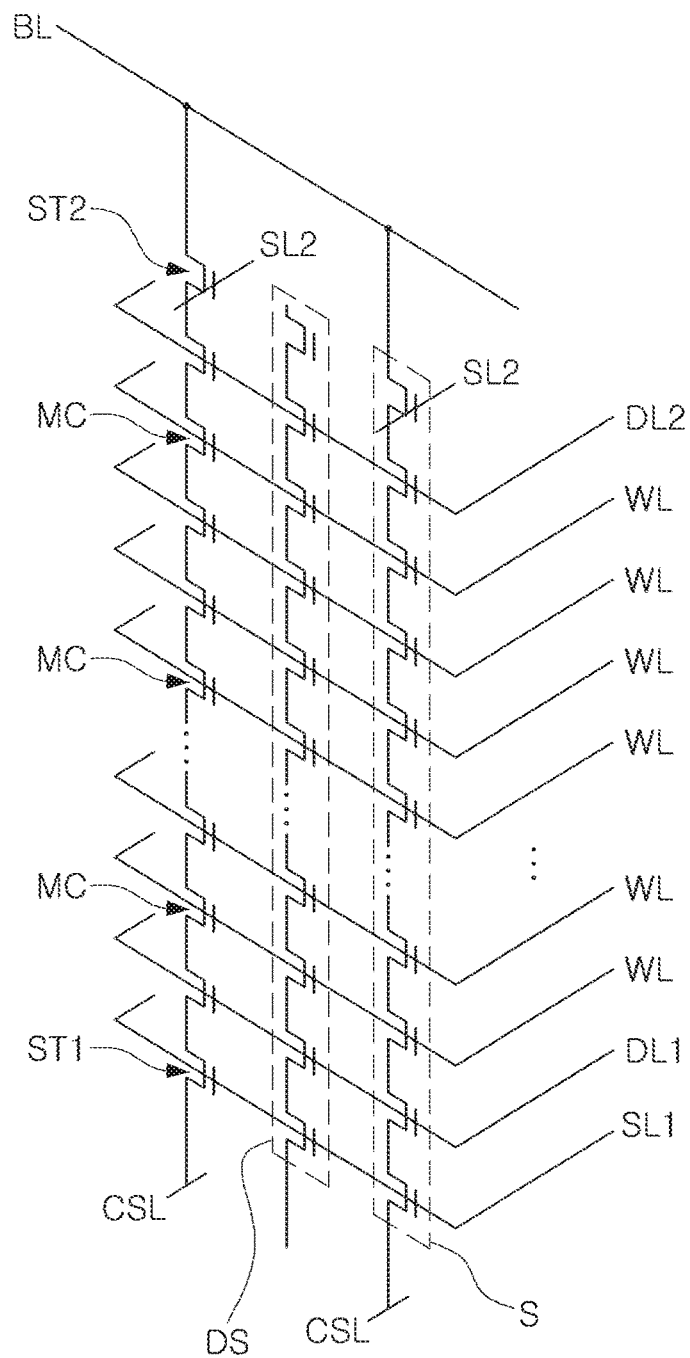
FIG. 2 is a circuit diagram conceptually illustrating a memory cell array region of a three-dimensional semiconductor memory device, according to an example embodiment.

An example embodiment of a circuit of each memory block BLK of the memory cell array region (e.g., memory cell array region 20 in FIG. 1) of the three-dimensional semiconductor memory device (e.g., three-dimensional semiconductor memory device 10 in FIG. 1) illustrated in FIG. 1 will be explained with reference to FIG. 2. FIG. 2 may be a circuit diagram conceptually illustrating an example of the memory cell array region (e.g., memory cell array region 20 in FIG. 1).

Referring to FIG. 2, each of the memory blocks BLK of the memory cell array region (e.g., memory cell array region 20 in FIG. 1) may include memory cells MC connected to each other in series, and a first selection transistor ST1 and a second selection transistor ST2, connected in series at either end of the memory cells MC.

The first and second selection transistors ST1 and ST2, and the memory cells MC between the first and second selection transistors ST1 and ST2 may constitute memory strings S. Gate terminals of the memory cells MC connected to each other in series may be connected to word lines WL for selecting the memory cells MC, respectively.

The gate terminal of the first selection transistor ST1 may be connected to a first selection line SL1, and a source terminal may be connected to a common source line CSL. The gate terminal of the second selection transistor ST2 may be connected to a second selection line SL2, and a source terminal of the second selection transistor ST2 may be connected to a drain terminal of the memory cells MC.

In one embodiment, the first selection transistor ST1 may be a ground selection transistor, and the second selection transistor ST2 may be a string selection transistor. The first selection line SL1 may be the ground selection line (e.g., ground selection line GSL in FIG. 1) in FIG. 1, and the second selection line SL2 may be the string selection line (e.g., string selection line SSL in FIG. 1) in FIG. 1.

Although FIG. 2 illustrates a structure in which the first selection transistor ST1 and the second selection transistor ST2 are connected to the memory cells MC connected to each other in series, respectively, the plurality of first selection transistors ST1 or the plurality of second selection transistors ST2 may be connected thereto.

In one example embodiment, a first dummy line DL1 may be disposed between a lowermost word line among the word lines WL and the first selection line SL1, and a second dummy line DL2 may be disposed between an uppermost word line among the word lines WL and the second selection line SL2. In some embodiments, a plurality of first dummy lines DL1 may be disposed between a lowermost word line among the word lines WL and the first selection line SL1, and a plurality of second dummy lines DL2 may be disposed between an uppermost word line among the word lines WL and the second selection line SL2.

Dummy lines, such as dummy word lines, in memory devices are not effective to cause transmission of data to be used by external devices. For instance, a dummy line may not be electrically connected to gates of normal memory cells, or if a dummy gate line is electrically connected to gates of dummy memory cells, such dummy gate lines may not be activated or if activated, may not result in communication of or use by any data in such dummy memory cells to a source external to the memory device.

The drain terminal of the second selection transistor ST2 may be connected to the bit line BL. When a signal is applied to the gate terminal of the second selection transistor ST2 through the second selection line SL2, a signal applied through the bit line BL may be transferred to the memory cells MC connected to each other in series, whereby data reading and writing operations may be performed. Further, by applying a predetermined erasing voltage through the substrate, an erasing operation for erasing the data recorded in the memory cells MC may be performed.

The semiconductor device according to an example embodiment may include at least one dummy string DS. The dummy string DS may be a string of dummy memory cells including a dummy channel electrically separated from the bit line BL.

Figure 3:
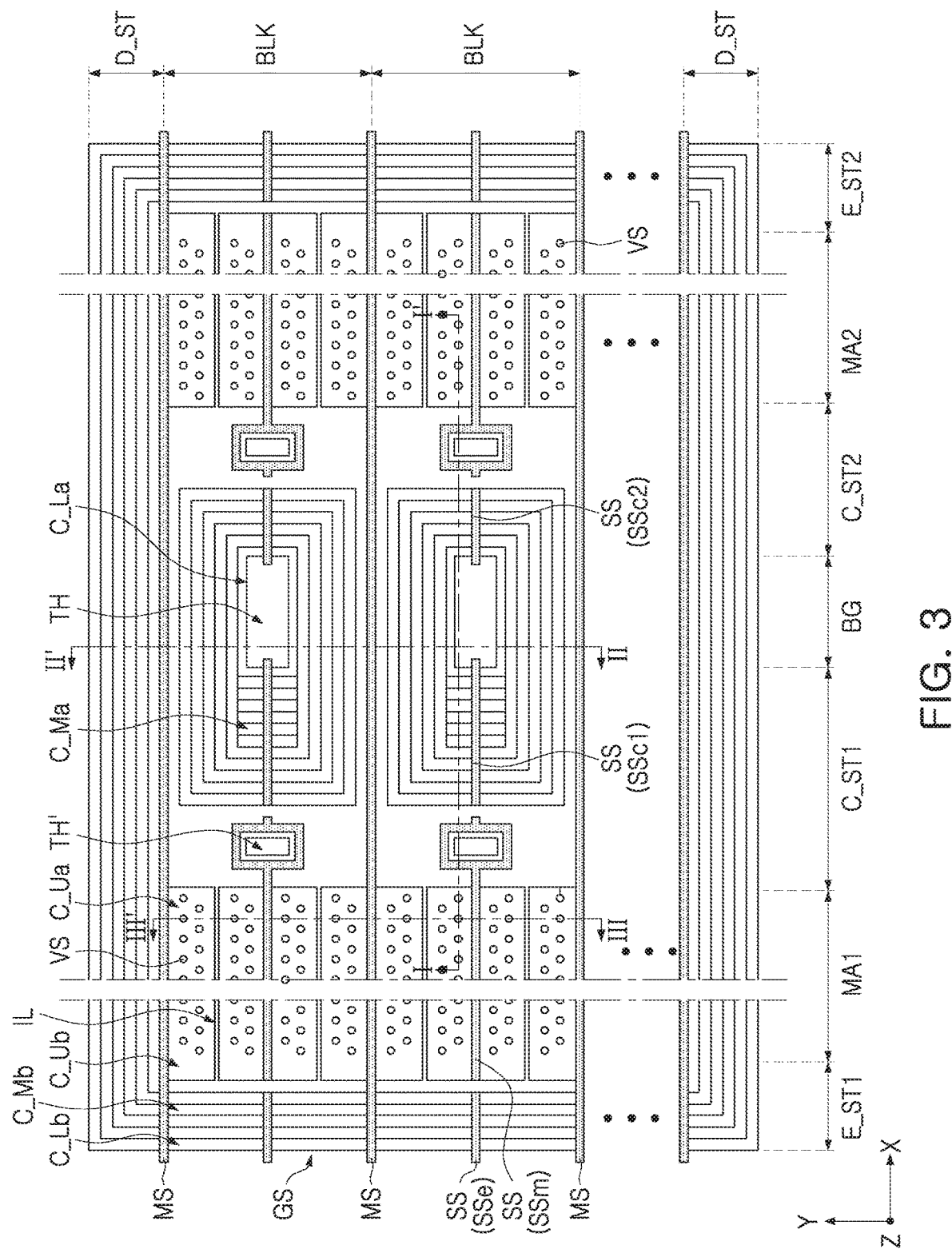
FIG. 3 is a plan view schematically illustrating a three-dimensional semiconductor memory device, according to an example embodiment.
Figure 4:
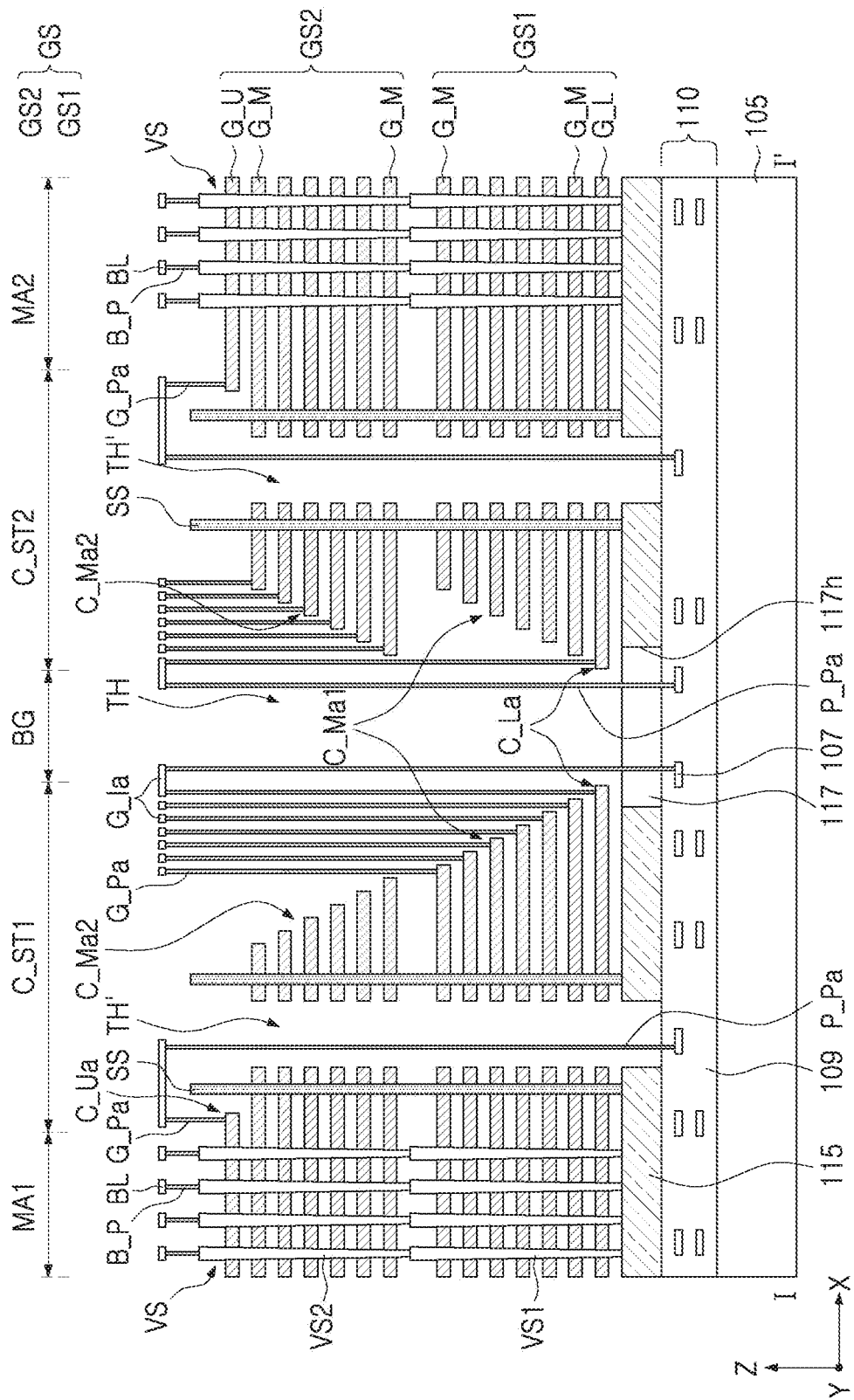
FIGS. 4 to 6 are cross-sectional views schematically illustrating a three-dimensional semiconductor memory device, according to an example embodiment.
Figure 5:
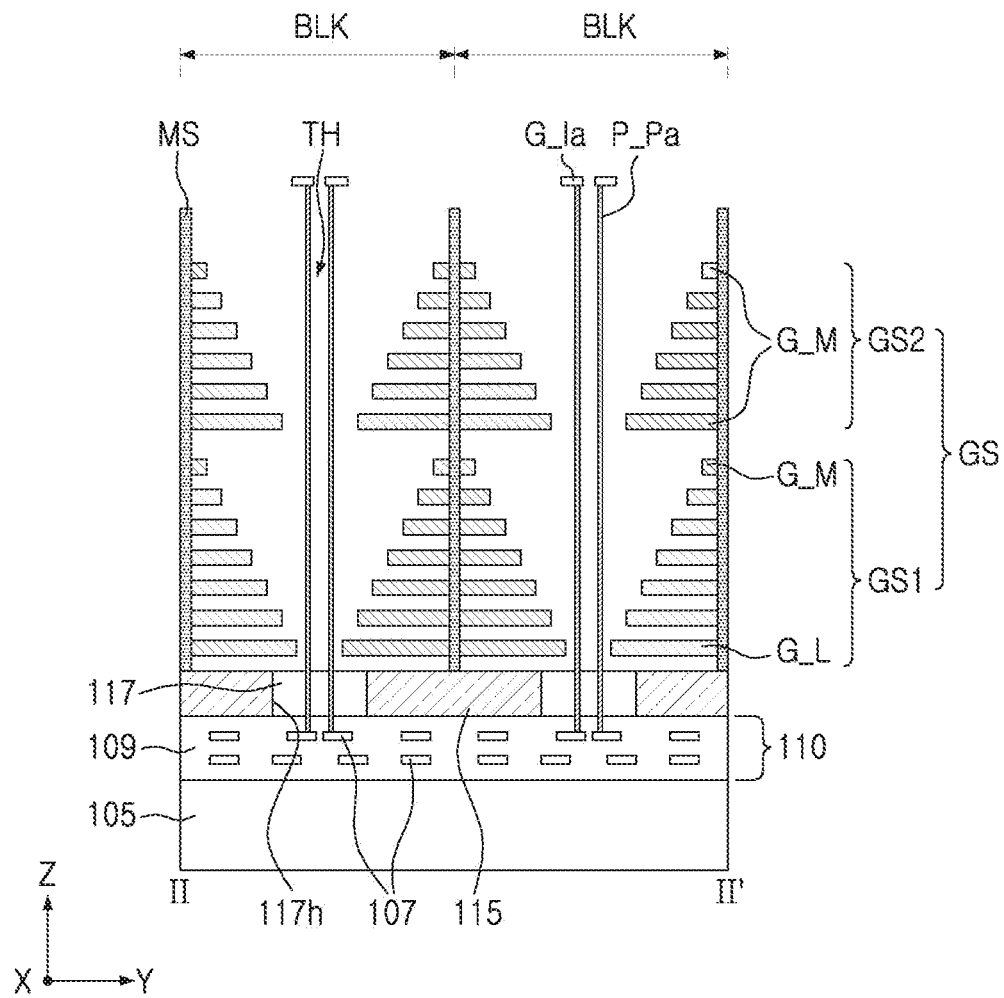
Figure 6:
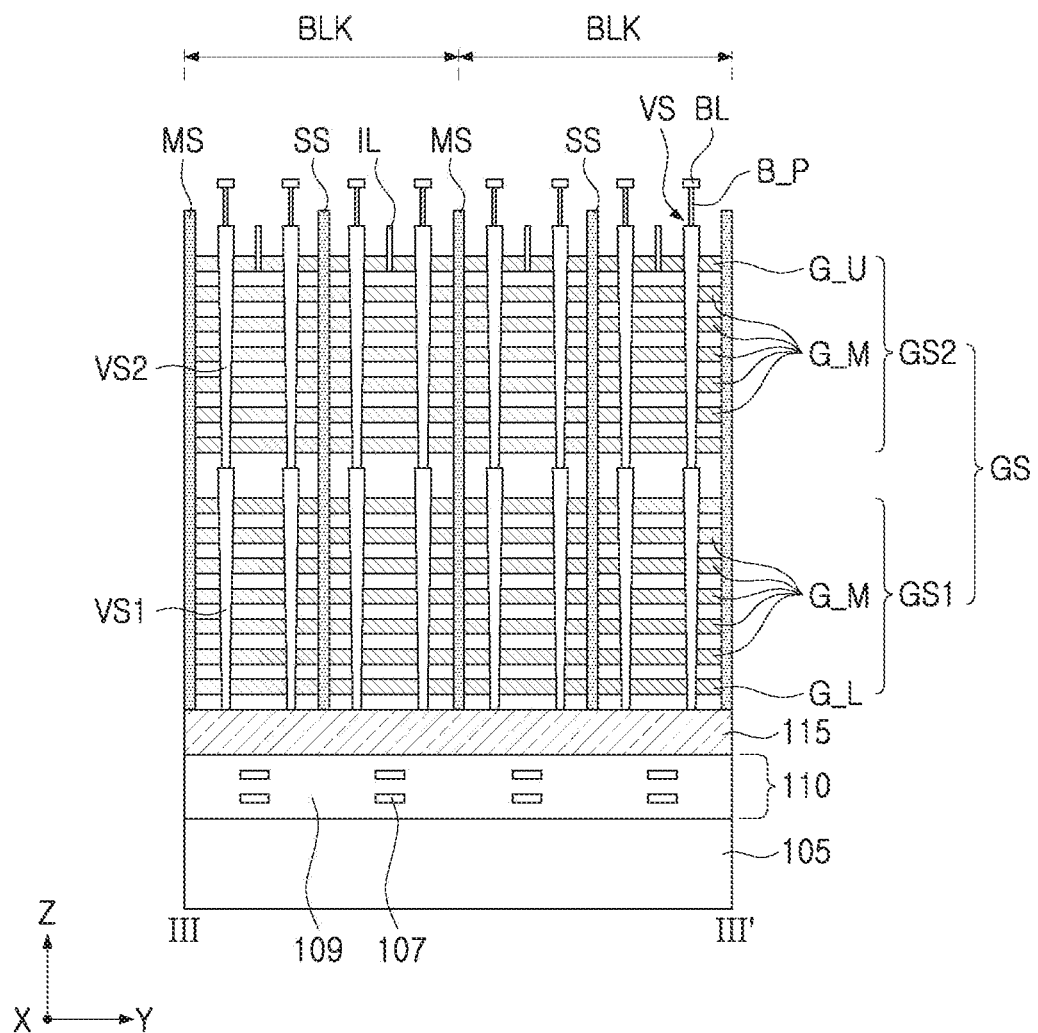

FIG. 3 is a plan view schematically illustrating a three-dimensional semiconductor memory device according to an example embodiment, and FIGS. 4 to 6 are cross-sectional views schematically illustrating a three-dimensional semiconductor memory device according to an example embodiment. In FIGS. 4 to 6, FIG. 4 is a cross-sectional view schematically illustrating a region taken along line I-I' in FIG. 3, FIG. 5 is a cross-sectional view schematically illustrating a region taken along line II-IF in FIG. 3, and FIG. 6 is a cross-sectional view schematically illustrating a region taken along line in FIG. 3.

Referring to FIGS. 3, 4, 5, and 6, a lower structure 110 including a peripheral circuit 107 may be disposed on a lower substrate 105. The lower substrate 105 may be a semiconductor substrate that may be formed of a semiconductor material such as single crystal silicon or the like.

The lower structure 110 may include a lower insulator 109 covering the peripheral circuit 107. The peripheral circuit 107 may be a circuit that may be formed in the control logic region (e.g., control logic region 30 in FIG. 1) illustrated in FIG. 1. The peripheral circuit 107 may include peripheral wirings electrically connecting peripheral transistors. The lower insulator 109 may be formed of an insulating material such as silicon oxide.

A base substrate 115 may be disposed on the lower structure 110. The base substrate 115 may be a semiconductor substrate that may be formed of a semiconductor material such as polysilicon. The base substrate 115 may be an upper substrate.

A gap fill insulation layer 117 may be disposed in a hole 117h passing through the base substrate 115. The gap fill insulation layer 117 may pass through at least a portion of the base substrate 115. The gap fill insulation layer 117 may be formed of an insulating material such as silicon oxide. In some embodiments, the gap fill insulation layer 117 may have a bottom surface that is coplanar with a bottom surface of the base substrate 115, and a top surface that is coplanar with a top surface of the base substrate 115. The bottom surface of the gap fill insulation layer 117 may be in contact with a top surface of the lower structure 110 (e.g., a top surface of the lower insulator 109).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Memory cell array regions MA1 and MA2 may be arranged on the base substrate 115 in sequence in a first direction (an X direction). The memory cell array regions MA1 and MA2 may include a first memory cell array region MA1 and a second memory cell array region MA2. Each of the first and second memory cell array regions MA1 and MA2 may correspond to the memory cell array region 20 described in FIG. 1.

A first inner stepped region C_ST1 and a second inner stepped region C_ST2 may be arranged between the first memory cell array region MA1 and the second memory cell array region MA2. A bridge region BG may be disposed between the first inner stepped region C_ST1 and the second inner stepped region C_ST2. A first outer stepped region E_ST1 facing the first inner stepped region C_ST1 may be disposed with the first memory cell array region MA1 therebetween. Therefore, the first memory cell array region MA1 may be disposed between the first inner stepped region C_ST1 and the first outer stepped region E_ST1. A second outer stepped region E_ST2 facing the second inner stepped region C_ST2 may be disposed with the second memory cell array region MA2 therebetween. Therefore, the second memory cell array region MA2 may be disposed between the second inner stepped region C_ST2 and the second outer stepped region E_ST2.

In one embodiment, the first outer stepped region E_ST1, the first memory cell array region MA1, the first inner stepped region C_ST1, the bridge region BG, the second inner stepped region C_ST2, the second memory cell array region MA2, and the second outer stepped region E_ST2 may be sequentially arranged in the first direction (the X direction).

Dummy stepped regions D_ST may be disposed on the plane such that the dummy stepped regions D_ST are arranged in a second direction (a Y direction) perpendicular to the first direction (the X direction) and opposite to each other. The first and second memory cell array regions MA1 and MA2, the first outer stepped region E_ST1, the first inner stepped region C_ST1, the bridge region BG, the second inner stepped region C_ST2, and the second outer stepped region E_ST2 may be arranged between the dummy stepped regions D_ST. Memory blocks BLK may be disposed between the dummy stepped regions D_ST.

A gate stacked structure GS may be disposed in the plurality of memory cell array regions, for example, the first and second memory cell array regions MA1 and MA2, and may extend lengthwise to the first and second outer stepped regions E_ST1 and E_ST2 and the first and second inner stepped region C_ST1 and C_ST2. The gate stacked structure GS disposed in the first and second memory cell array regions MA1 and MA2 may be connected to each other in the bridge region BG. Through regions TH passing through the gate stacked structure GS may be disposed in the bridge region BG. Each of the through regions TH may be surrounded by the gate stacked structure GS. For example, the through regions TH may pass through the gate stacked structure GS in a third direction (a Z direction), and may be surrounded by the gate stacked structure GS in the first and second directions (the X and Y directions). On the same plane, the through region TH may be surrounded by one middle gate electrode G_M, i.e., one word line WL. The through regions TH may be disposed in a position overlapping the gap fill insulation layer 117. For example, the through regions TH may be disposed above the gap fill insulation layer 117 in the third direction (the Z direction). Through regions TH may include an insulating material.

Auxiliary through regions TH' may be disposed adjacent to the through regions TH and pass through the gate stacked structure GS in the first and second inner stepped regions C_ST1 and C_ST2. For example, the auxiliary through regions TH' may be disposed on either side of the through regions TH in the first direction (the X direction). In some embodiments, the auxiliary through regions TH' may be centered on a longitudinal axis of the through region TH, from a top down view (e.g., viewed from the Z direction). Auxiliary through regions TH' may include an insulating material.

The gate stacked structure GS may include a first gate stacked structure GS1 and a second gate stacked structure GS2 stacked on the base substrate 115 in the third direction (the Z direction) in sequence, perpendicular to a surface of the base substrate 115. The gate stacked structure GS may include gate electrodes G_L, G_M, and G_U spaced apart from each other in the third direction (the Z direction), perpendicular to the surface of the base substrate 115. The gate electrodes G_L, G_M and G_U may include a lower gate electrode G_L, middle gate electrodes G_M disposed on the lower gate electrode G_L, and an upper gate electrode G_U disposed on the middle gate electrodes G_M. The first gate stacked structure GS1 may include the lower gate electrode G_L and a first set of the middle gate electrodes G_M, spaced apart from each other in the third direction (the Z direction). The second gate stacked structure GS2 may include a second set of the middle gate electrodes G_M and the upper gate electrode G_U spaced apart from each other in the third direction (the Z direction). In one embodiment, the upper gate electrode G_U may include a plurality of electrodes spaced apart from each other in the third direction (the Z direction).

The gate electrodes G_L, G_M and G_U may be formed of a conductive material including at least one of doped polysilicon, a metal nitride such as titanium nitride, and a metal such as tungsten.

The upper gate electrodes G_U may be spaced apart from each other in the first and/or second directions (the X and/or Y directions) with the through region TH therebetween. The upper gate electrodes G_U may be disposed in the first and second memory cell array regions MA1 and MA2, respectively, and may not be electrically connected to each other. The middle and lower gate electrodes G_M and G_L disposed in the first and second memory cell array regions MA1 and MA2 may be electrically connected to each other in the bridge region BG. The middle and lower gate electrodes G_M and G_L may surround the through region TH in the first and second directions (the X and Y directions).

The lower gate electrode G_L may be the first selection line (e.g., first selection line SL1 in FIG. 2) as described in FIG. 2, and the upper gate electrode G_U may be the second selection line (e.g., second selection line SL2 in FIG. 2) as described in FIG. 2. The middle gate electrodes G_M may be the word lines (e.g., word lines WL in FIG. 2) as described in FIG. 2. In the following, the description of the middle gate electrodes G_M can be explained or understood by replacing the same with the word lines (e.g., word lines WL in FIG. 2).

Main separation structures MS extending lengthwise in the first direction (the X direction) may be disposed. The main separation structures MS may pass through the gate stacked structure GS in the third direction (the Z direction) to contact the base substrate 115. The main separation structures MS may be linear shapes parallel to each other in the first direction (the X direction), when seen in a plan view, and may separate the gate stacked structure GS in the second direction (the Y direction). For example, the main separation structures MS, which extend lengthwise in the second direction (the Y direction), may separate the first gate stacked structure GS1 in the second direction (the Y direction) and the second gate stacked structure GS2 in the second direction (the Y direction). The gate stacked structure GS may have a linear shape extending lengthwise in the first direction (the X direction), and may be separated by the main separation structures MS in the second direction (the Y direction).

In one embodiment, the through regions TH and the auxiliary through regions TH' may be arranged between adjacent main separation structures MS.

In one embodiment, in each of the first and second memory cell array regions MA1 and MA2, memory blocks BLK may be disposed between the pair of main separation structures MS adjacent to each other, as illustrated in FIG. 3. Therefore, the main separation structures MS may serve to separate the memory blocks BLK from each other. One through region TH may be arranged for each memory block BLK, and two auxiliary through regions TH' may be arranged for each memory block BLK.

One auxiliary separation structure SS may be disposed between adjacent main separation structures MS. The auxiliary separation structures SS may also pass through the gate stacked structure GS in the third direction (the Z direction) to contact the base substrate 115. The auxiliary separation structures SS may include a plurality of portions to be sequentially arranged in the first direction (the X direction). For example, the auxiliary separation structures SS may include memory separation portions SSm that extend lengthwise in the first direction (the X direction) and intersect the first and second memory cell array regions MA1 and MA2. In addition, the auxiliary separation structures SS may include edge separation portions SSe having end portions facing and spaced apart from end portions of the memory separation portions SSm. The edge separation portions SSe may be disposed in the first and second outer stepped regions E_ST1 and E_ST2, extending lengthwise in the first direction (the X direction). Further, the auxiliary separation structures SS may include middle separation portions SSc1 and SSc2 having end portions facing and spaced apart from end portions of the memory separation portions SSm The middle separation portions SSc1 and SSc2 may be disposed in the first and second inner stepped regions C_ST1 and C_ST2, extending lengthwise in the first direction (the X direction). The middle separation portions SSc1 and SSc2 may include a first middle separation portion SSc1 disposed in the first inner stepped region C_ST1 and a second middle separation portion SSc2 disposed in the second inner stepped region C_ST2. In the first direction (the X direction), a width of the second inner stepped region C_ST2 may be narrower than a width of the first inner stepped region C_ST1. In the first direction (the X direction), a length of the second middle separation portion SSc2 may be shorter than a length of the first middle separation portion SSc1. In the first direction (the X direction), a length of the gate stacked structure GS disposed in the second inner stepped region C_ST2 may be shorter than a length of the gate stacked structure GS disposed in the first inner stepped region C_ST1.

The memory separation portions SSm may surround the auxiliary through regions TH' in the first and second directions (the X and Y directions) and extend to the first and second inner stepped regions C_ST1 and C_ST2.

A plurality of the upper gate electrodes G_U spaced apart from each other in the second direction (the Y direction) may be disposed on the same plane between a pair of main separation structures MS adjacent to each other. For example, between a pair of main separation structures MS adjacent to each other, in one memory block BLK, four upper gate electrodes G_U may be separated from each other by a auxiliary separation structure SS disposed between the pair of main separation structures MS and an insulation line IL disposed between the auxiliary separation structure SS and the main separation structures MS. In this case, the insulation line IL may be disposed on the middle gate electrodes G_M, and may extend lengthwise in the first direction (the X direction).

The gate stacked structure GS may have gate contact pads C_Ua, C_Ub, C_Ma, C_Mb, C_La, and C_Lb.

The gate contact pads C_Ua, C_Ub, C_Ma, C_Mb, C_La and C_Lb may include the inner and outer upper contact pads C_Ua and C_Ub of the upper gate electrode G_U, the inner and outer middle contact pads C_Ma and C_Mb of the middle gate electrodes G_M, and the inner and outer lower contact pads C_La and C_Lb of the lower gate electrodes G_L. For example, the upper gate electrode G_U may have the inner upper contact pad C_Ua located in the first and second inner stepped regions C_ST1 and C_ST2, and the outer upper contact pad C_Ub located in the first and second outer stepped regions E_ST1 and E_ST2. The middle gate electrodes G_M may have the inner middle contact pads C_Ma located in the first and second inner stepped regions C_ST1 and C_ST2 and the bridge region BG, and have the outer middle contact pads C_Mb located in the first and second outer stepped regions E_ST1 and E_ST2. The lower gate electrode G_L may have the inner lower contact pad C_La located in the first and second inner stepped regions C_ST1 and C_ST2 and the bridge region BG, and the outer lower contact pad C_Lb located in the first and second outer stepped regions E_ST1 and E_ST2.

The inner lower contact pad C_La, the inner middle contact pads C_Ma, and the inner upper contact pad C_Ua may form middle steps that are disposed at a lower vertical level as the middle steps extend in a direction toward the through region TH. For example, the middle steps, which may include the inner lower contact pad C_La, the inner middle contact pads C_Ma, and the inner upper contact pad C_Ua, may include steps that are disposed lower in the third direction (the Z direction) as the middle steps extend in the first direction (the X direction) and may include steps that are disposed lower in the third direction (the Z direction) as the middle steps extend in the second direction (the Y direction).

The inner middle contact pads C_Ma may include the first middle contact pads C_Ma1 and the second middle contact pads C_Ma2, stacked on the base substrate 115.

The middle gate electrodes G_M of the first gate stacked structure GS1 may include first middle contact pads C_Ma1 surrounding the through regions TH in the first and second directions (the X and Y directions) and disposed in a stepped shape toward the through regions TH. For example, when viewed in a cross-sectional view, the first middle contact pads C_Ma1 may have a stepped shape that lowers in the direction of the through regions TH. The middle gate electrodes G_M of the second gate stacked structure GS2 may include second middle contact pads C_Ma2 surrounding the through regions TH in the first and second directions (the X and Y directions) and disposed in a stepped shape lowered toward the through regions TH. For example, when viewed in a cross-sectional view, the second middle contact pads C_Ma2 may have a stepped shape that lowers in the direction of the through regions TH. Further, the second middle contact pads C_Ma2 may cover a portion of the first middle contact pads C_Ma1. For example, when viewed in a plan view, the second middle contact pads C_Ma2 may overlap a portion of the first middle contact pads C_Ma1.

A portion of the auxiliary separation structures SS, i.e., a first middle separation portion SSc1 disposed in the first inner stepped region C_ST1 and a second middle separation portion SSc2 disposed in the second inner stepped region C_ST2, may pass through the first and second middle contact pads C_Ma1 and C_Ma2. For example, each of the first middle separation portion SSc1 and the second middle separation portion SSc2 may extend lengthwise in the first direction (the X direction). In some embodiments, each of the first middle separation portion SSc1 and the second middle separation portion SSc2 may bisect the first and second middle contact pads C_Ma1 and C_Ma2.

Edge steps that may consist of the outer lower contact pads C_Lb, the outer middle contact pads C_Mb and the outer upper contact pads C_Ub may include steps that may be lowered in the first direction (the X direction) away from the first and second memory cell array regions MA1 and MA2. For example, when viewed in a cross-sectional view, the outer lower contact pads C_Lb, the outer middle contact pads C_Mb and the outer upper contact pads C_Ub may have a stepped shape that lowers in the direction away from the first and second memory cell array regions MA1 and MA2.

The middle gate electrodes G_M and the lower gate electrodes G_L may serve as a single gate electrode electrically connected to each other on the same plane by the connection portions in which the auxiliary separation structures SS are disconnected in the first direction (the X direction). In one embodiment, the lower gate electrodes G_L, which are spaced apart from each other in the second direction (the Y direction), may be disposed on the same plane between a pair of adjacent main separation structures MS.

Vertical channel structures VS may be disposed in the first and second memory cell array regions MA1 and MA2. The vertical channel structures VS may be disposed on the base substrate 115, and may pass through the gate stacked structure GS. The vertical channel structures VS may include a first vertical channel structure VS1 and a second vertical channel structure VS2, stacked on the base substrate 115. The first vertical channel structure VS1 may pass through the first gate stacked structure GS1, and the second vertical channel structure VS2 may pass through the second gate stacked structure GS2. A lower end of the first vertical channel structure VS1 may contact the base substrate 115. A lower end of the second vertical channel structure VS2 may contact an upper end of the first vertical channel structure VS1. The bit lines BL, as described in FIGS. 1 and 2, may be disposed on the vertical channel structures VS. Bit line contact plugs B P may be disposed between the bit lines BL and the vertical channel structures VS.

The gate stacked structure GS may be electrically connected to the peripheral circuit 107 in the lower structure 110.

In one embodiment, a portion of the gate stacked structures GS may be electrically connected to the peripheral circuit 107 through the first and second inner stepped regions C_ST1 and C_ST2.

Gate contact plugs G_Pa may be disposed on the gate contact pads C_Ua, C_Ma, and C_La of the gate stacked structure GS in the first and second inner stepped regions C_ST1 and C_ST2. Peripheral contact plugs P_Pa may be disposed on the peripheral circuit 107.

A portion of the gate contact plugs G_Pa may be disposed on the gate contact pads C_Ma and C_La of the first gate stacked structure GS1, and the other portion of the gate contact plugs G_Pa may be disposed on the contact pads C_Ua and C_Ma of the second gate stacked structure GS2.

The peripheral contact plugs P_Pa may be electrically connected to the peripheral circuit 107 through the gap fill insulation layer 117 and the through region TH or through the auxiliary through region TH'. For example, the peripheral contact plugs P_Pa may extend in the third direction (the Z direction) through the gap fill insulation layer 117 and the through region TH, or through the auxiliary through region TH', to contact the peripheral circuit 107.

Gate connection wirings G_Ia electrically connecting the gate contact plugs G_Pa and the peripheral contact plugs P_Pa may be disposed above the gate contact plugs G_Pa and the peripheral contact plugs P_Pa.

The gate electrodes G_L, G_M, and G_U of the gate stacked structure GS may be electrically connected to the peripheral circuit 107 by the gate contact plugs G_Pa, the peripheral contact plugs P_Pa, and the gate connection wirings G_Ia.

In one embodiment, a portion of the gate stacked structures GS may be electrically connected to the peripheral circuit 107 through the first and second outer stepped regions E_ST1 and E_ST2.

In one embodiment, the upper gate electrode G_U may be electrically connected to the peripheral circuit 107 by the gate contact plug G_Pa on the inner upper contact pad C_Ua, the peripheral contact plug P_Pa passing through the auxiliary through region TH' and electrically connected to the peripheral circuit 107, and the gate connection wiring G_Ia electrically connecting the gate contact plug G_Pa and the peripheral contact plug P_Pa.

In one embodiment, at least a portion of the middle gate electrodes G_M and the lower gate electrode G_L may be connected to the peripheral circuit 107 by the gate contact plug G_Pa on the inner middle contact pads C_Ma, the peripheral contact plug P_Pa passing through the through region TH and electrically connected to the peripheral circuit 107, and the gate connection wiring G_Ia electrically connecting the gate contact plug G_Pa and the peripheral contact plug P_Pa. In the first and second inner stepped regions C_ST1 and C_ST2, the inner middle contact pads C_Ma may include the first middle contact pads C_Ma1 disposed in a stepped shape by the word lines of the first gate stacked structure GS1, and the second middle contact pads C_Ma2 disposed in a stepped shape by the word lines of the second gate stacked structure GS2. The second middle contact pads C_Ma2 may be disposed to overlap the first middle contact pads C_Ma1, at least in the second inner stepped region C_ST2. The second middle contact pads C_Ma2 may be also disposed to overlap the first middle contact pads C_Ma1 in the bridge region BG. In the first inner stepped region C_ST1, the second middle contact pads C_Ma2 may be spaced apart from the first middle contact pads C_Ma1 in the first direction (the X direction).

In the first and second inner stepped regions C_ST1 and C_ST2, the contact pads C_Ua and C_Ma2 of the second gate stacked structure GS2 may form a stepped structure having an inclined angle with respect to an upper surface of a base substrate 115 that is the same as the inclined angle of the stepped structure formed of the contact pads C_Ma1 and C_La of the first gate stacked structure GS1.

A portion (one or more) of the gate contact plugs G_Pa may be disposed on the second middle contact pads C_Ma2 in the second inner stepped region C_ST2, and the other portion (one or more) of the gate contact plugs G_Pa may be disposed on the first middle contact pads C_Ma1 that do not overlap with the second middle contact pads C_Ma2 in the first inner stepped region C_ST1.

Figure 7:
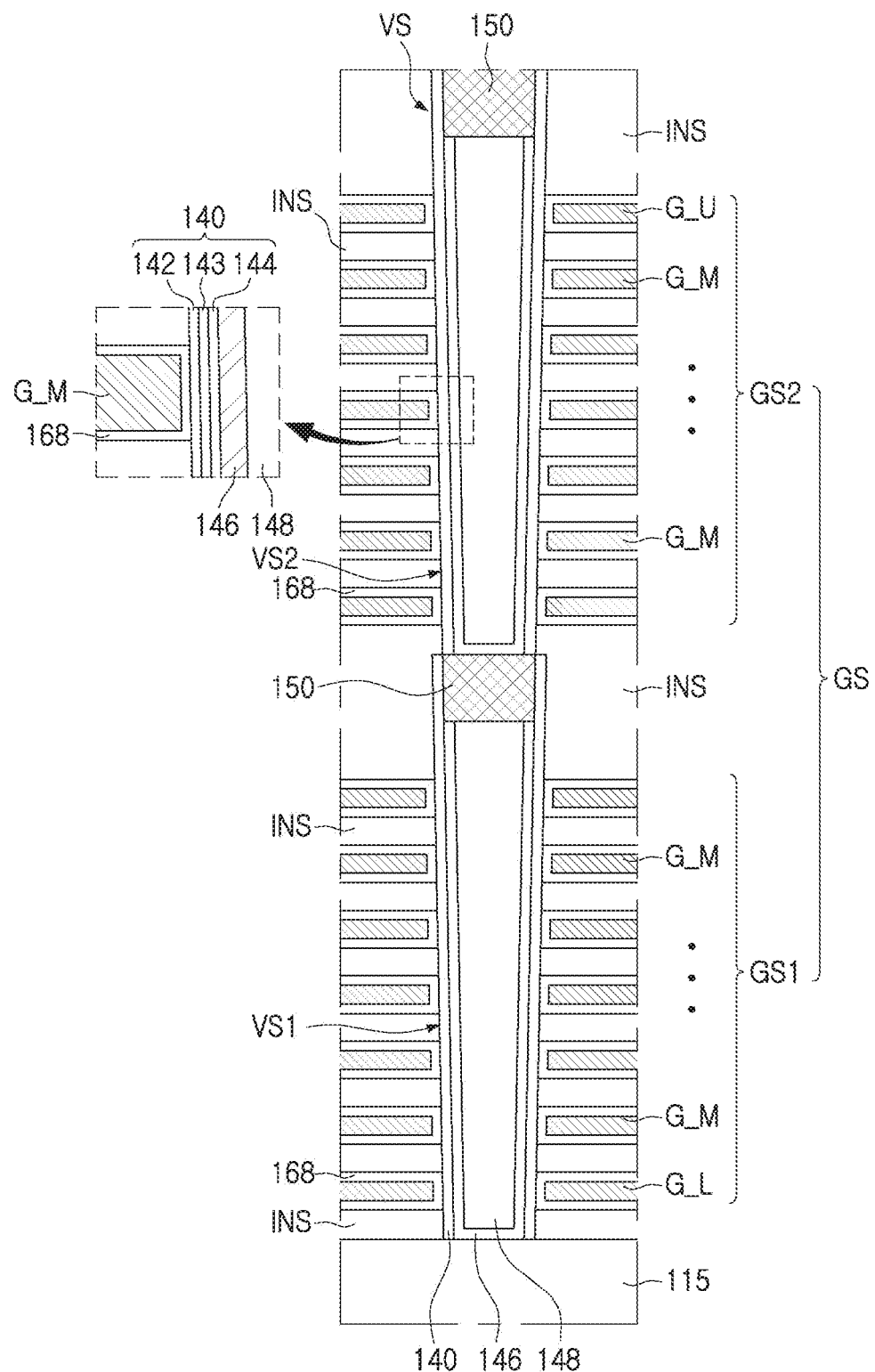
FIGS. 7 and 8 are cross-sectional views schematically illustrating a portion of a three-dimensional semiconductor memory device, according to an example embodiment.

FIG. 7 is a schematic cross-sectional view illustrating an example embodiment of the vertical channel structures VS, as described with reference to FIGS. 3 to 6.

Referring to FIG. 7, together with FIGS. 3 to 6, the gate stacked structure GS including the gate electrodes G_L, G_M, and G_U may be disposed on the base substrate 115, as described above. The gate stacked structure GS may include the first gate stacked structure GS1 and the second gate stacked structure GS2.

Each of the vertical channel structures VS may pass through the gate stacked structure GS. The vertical channel structures VS may include the first vertical channel structure VS1 passing through the first gate stacked structure GS1 and the second vertical channel structure VS2 passing through the second gate stacked structure GS2.

The first vertical channel structure VS1 may include an insulating core layer 148 extending lengthwise in a direction perpendicular to the surface of the base substrate 115 and passing through the first gate stacked structure GS1, a channel semiconductor layer 146 covering side surfaces and a bottom surface of the insulating core layer 148, a first gate dielectric 140 surrounding an outer surface of the channel semiconductor layer 146, and a pad layer 150 disposed on the insulating core layer 148 and electrically connected to the channel semiconductor layer 146. The pad layer 150 may be disposed on a top surface of the channel semiconductor layer 146 and may be surrounded by the first gate dielectric 140. The second vertical channel structure VS2 may include an insulating core layer 148 extending lengthwise in a direction perpendicular to the surface of the base substrate 115 and passing through the second gate stacked structure GS2, a channel semiconductor layer 146 covering side surfaces and a bottom surface of the insulating core layer 148, a first gate dielectric 140 surrounding an outer surface of the channel semiconductor layer 146, and a pad layer 150 disposed on the insulating core layer 148 and electrically connected to the channel semiconductor layer 146. The pad layer 150 may be disposed on a top surface of the channel semiconductor layer 146 and may be surrounded by the first gate dielectric 140.

The channel semiconductor layer 146 of the first vertical channel structure VS1 may contact a top surface of the base substrate 115, and the channel semiconductor layer 146 of the second vertical channel structure VS2 may contact a top surface of the pad layer 150 of the first vertical channel structure VS1. In some embodiments, the bottom surface of the first gate dielectric 140 of the first vertical channel VS1 may contact a top surface of the base substrate 115, and the bottom surface of the first gate dielectric 140 of the second vertical channel VS2 may contact a top surface of the pad layer 150 of the first vertical channel structure VS1.

An insulating material INS may be disposed between upper and lower portions of the gate stacked structure GS and between each of the gate electrodes G_L, G_M, and G_U. For example, the insulating material INS may be disposed above the upper gate electrode G_U, below the lower gate electrode G_L, and between each adjacent gate electrode G_L, G_M, and G_U. The insulating material INS may be formed of silicon oxide. Each of the vertical channel structures VS may pass through the insulating material INS, while passing through the gate stacked structure GS. For example, the insulating material INS may surround portions of the vertical channel structures VS.

In one embodiment, a second gate dielectric 168 disposed between the gate electrodes G_L, G_M, and G_U and the vertical channel structures VS, may be disposed to extend between the gate electrodes G_L, G_M, and G_U and the insulating material INS. For example, the second gate dielectric 168 may surround each of gate electrodes G_L, G_M, and G_U.

The channel semiconductor layer 146 may be electrically connected to the base substrate 115. The channel semiconductor layer 146 may be formed of a semiconductor material such as silicon, and the like. The pad layer 150 may be formed of doped polysilicon having an N-type conductivity. The insulating core layer 148 may be formed of an insulating material such as silicon oxide, and the like.

The first gate dielectric 140 may include a tunnel dielectric 144, an information storage layer 143, and a blocking dielectric 142. The information storage layer 143 may be disposed between the tunnel dielectric 144 and the blocking dielectric 142. The tunnel dielectric 144 may be close to the channel semiconductor layer 146, and the blocking dielectric 142 may be close to the gate stacked structure GS. For example, the tunnel dielectric 144 may surround an outside surface of the channel semiconductor layer 146, the information storage layer 143 may surround an outside surface of the tunnel dielectric 144, and the blocking dielectric 142 may surround an outside surface of the information storage layer 143. The second gate dielectric 168 may be disposed between the blocking dielectric 142 and the gate electrodes G_L, G_M, and G_U.

The tunnel dielectric 144 may comprise silicon oxide and/or impurity doped silicon oxide. The blocking dielectric 142 may comprise silicon oxide and/or a high dielectric. The information storage layer 143 may be a layer for storing information, disposed between the channel semiconductor layer 146 and the middle gate electrodes G_M. For example, the information storage layer 143 may be formed of materials (e.g., silicon nitride) which are capable of trapping and retaining electrons injected from the channel semiconductor layer 146 through the tunnel dielectric layer 144. The second gate dielectric 168 may include a high dielectric, e.g., A10, or the like.

The information storage layer 143 may store information in regions facing the middle gate electrodes G_M, which may correspond to the word lines WL illustrated in FIGS. 1 and 2 (e.g., word lines WL in FIGS. 1 and 2), among the gate stacked structures GS. The regions, which may store information in the information storage layer 143 within the vertical channel structure VS, may be arranged in a direction perpendicular to the surface of the base substrate 115, and may constitute the memory cells MC illustrated in FIG. 2.

The channel semiconductor layer 146 may be directly connected to the base substrate 115, but the disclosed embodiments may be not limited thereto.

Figure 8:
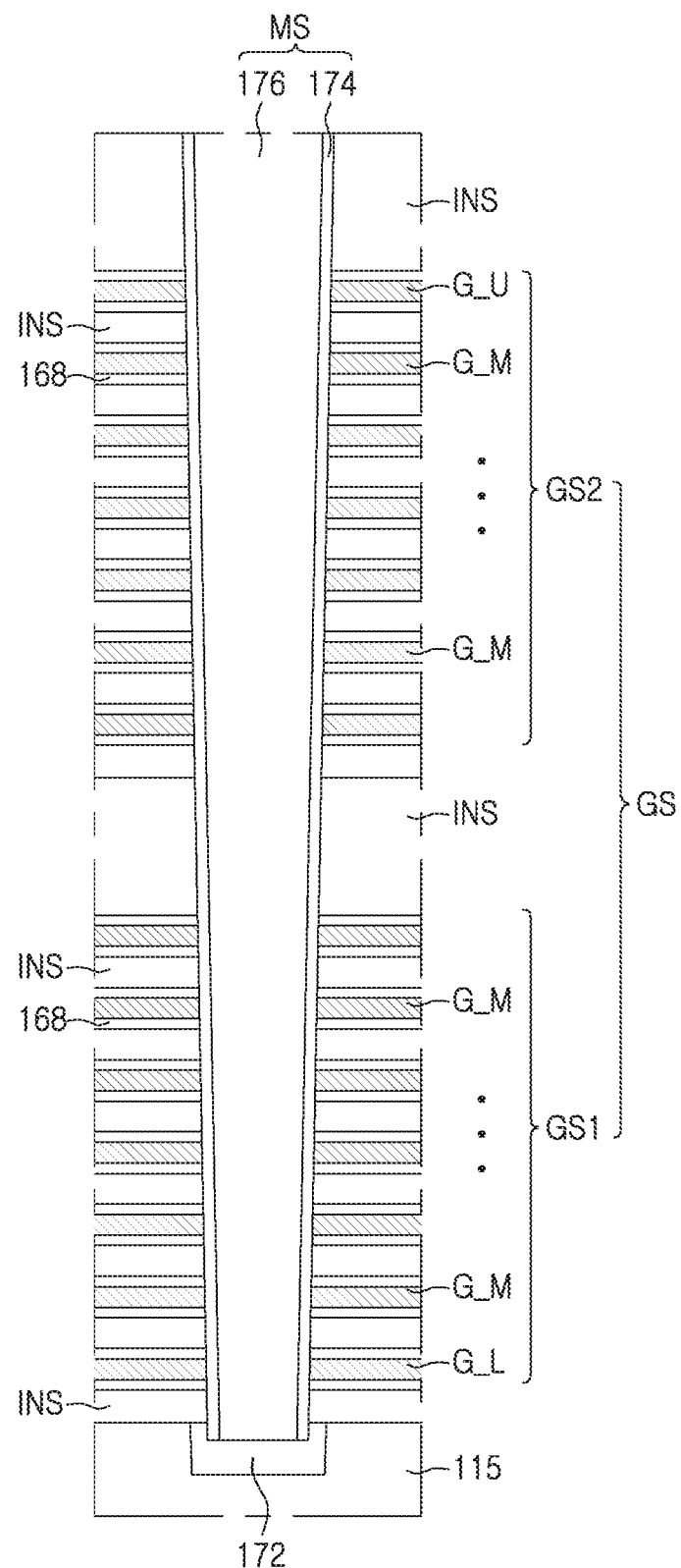

FIG. 8 may be a schematic cross-sectional view illustrating an example embodiment of the main separation structure MS as described with reference to FIGS. 3 to 6.

Referring to FIG. 8 together with FIGS. 3 to 6, the gate stacked structure GS may include the gate electrodes G_L, G_M, and G_U, and each of the main separation structures MS may pass through the gate electrodes G_L, G_M, and G_U of the gate stacked structure GS, as described above with reference to FIGS. 3 to 6.

The insulating material INS may be disposed above and below the upper and lower portions of the gate stacked structure GS and between the individual gate electrodes G_L, G_M, and G_U. Each of the main separation structures MS may pass through the gate electrodes G_L, G_M, and G_U of the gate stacked structure GS and the insulating material INS. The second gate dielectric 168 may be disposed to extend between the gate electrodes G_L, G_M, and G_U and the insulating material INS.

Each of the main separation structures MS may include a conductive pattern 176, and a spacer 174 covering side surfaces of the conductive pattern 176. The height of the spacer 174 may be the same as the height of the conductive pattern 176. The spacer 174 may be formed of an insulating material such as silicon oxide, silicon nitride, and the like. The spacer 174 may space the conductive pattern 176 apart from the gate stacked structure GS. The conductive pattern 176 may be formed of a conductive material containing at least one of doped polysilicon, metal nitride such as titanium nitride and the like, or metal such as tungsten and the like. In one embodiment, the auxiliary separation structures (e.g., auxiliary separation structures SS in FIGS. 3 to 6) may be formed of the same structure and the same material as the main separation structures MS.

An impurity region 172 may be disposed in the base substrate 115 in the lower portion of the main separation structures MS. For example, and an upper portion of the impurity region 172 may be recessed, and the spacer 174 and the conductive pattern 176 may contact the impurity region 172 in the recessed portion. The impurity region 172 may have N-type conductivity, and a portion of the base substrate 115 adjacent to the impurity region 172 may have P-type conductivity. The conductive pattern 176 and the impurity region 172 may be the common source line CSL described in FIG. 2.

Figure 9:
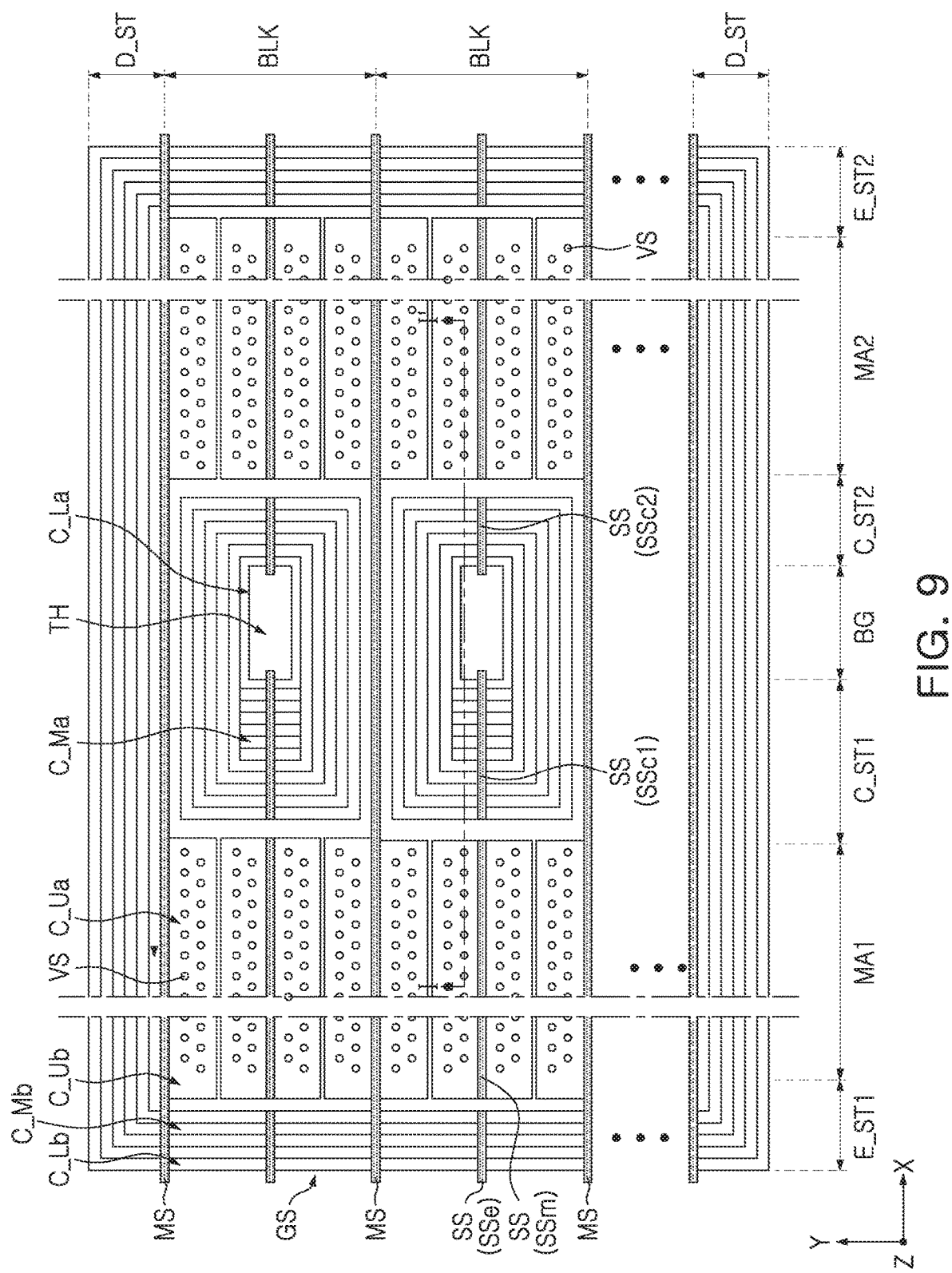
FIGS. 9 and 10 are a plan view and a cross-sectional view, respectively, schematically illustrating a three-dimensional semiconductor memory device, according to an example embodiment.
Figure 10:
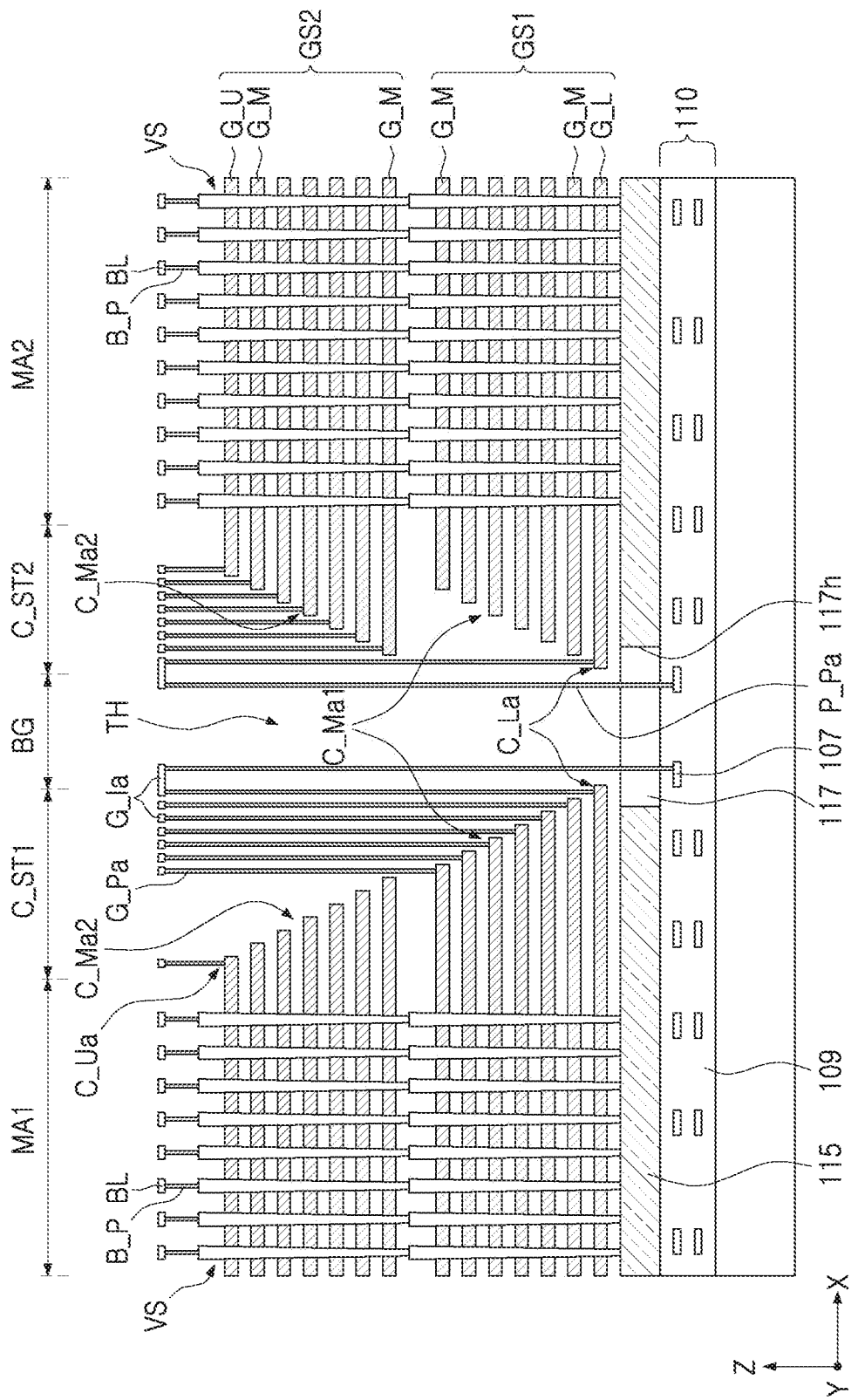

FIGS. 9 and 10 are a plan view and a cross-sectional view schematically illustrating a three-dimensional semiconductor memory device according to an example embodiment, respectively. In FIGS. 9 and 10, the description of the same portions as those of FIGS. 3 and 4 will be omitted, and only the other portions will be described briefly.

Referring to FIGS. 9 and 10, in a different manner to the three-dimensional semiconductor memory devices of FIGS. 3 and 4, auxiliary through regions TH' may not be formed in this embodiment.

Widths of the first and second inner connection regions C_ST1 and C_ST2 in a first direction (an X direction) may be narrowed as compared with the first and second inner connection regions C_ST1 and C_ST2 of the three-dimensional semiconductor memory devices of FIGS. 3 and 4. Further, widths of the first and second memory cell array regions MA1 and MA2 in the first direction (the X direction) may be widened as compared with the first and second memory cell array regions MA1 and MA2 of the three-dimensional semiconductor memory devices of FIGS. 3 and 4. In some embodiments, the numbers of vertical channel structures VS disposed in the first and second memory cell array regions MA1 and MA2 may be increased as compared to the three-dimensional semiconductor memory devices of FIGS. 3 and 4.

FIGS. 11 to 14 are plan views schematically illustrating a three-dimensional semiconductor memory device according to an example embodiment. In FIGS. 11 to 14, the detailed description of contents overlapping those described above will be omitted, and a description of a portion that may be modified in the above-described contents will mainly be made.

Figure 11:
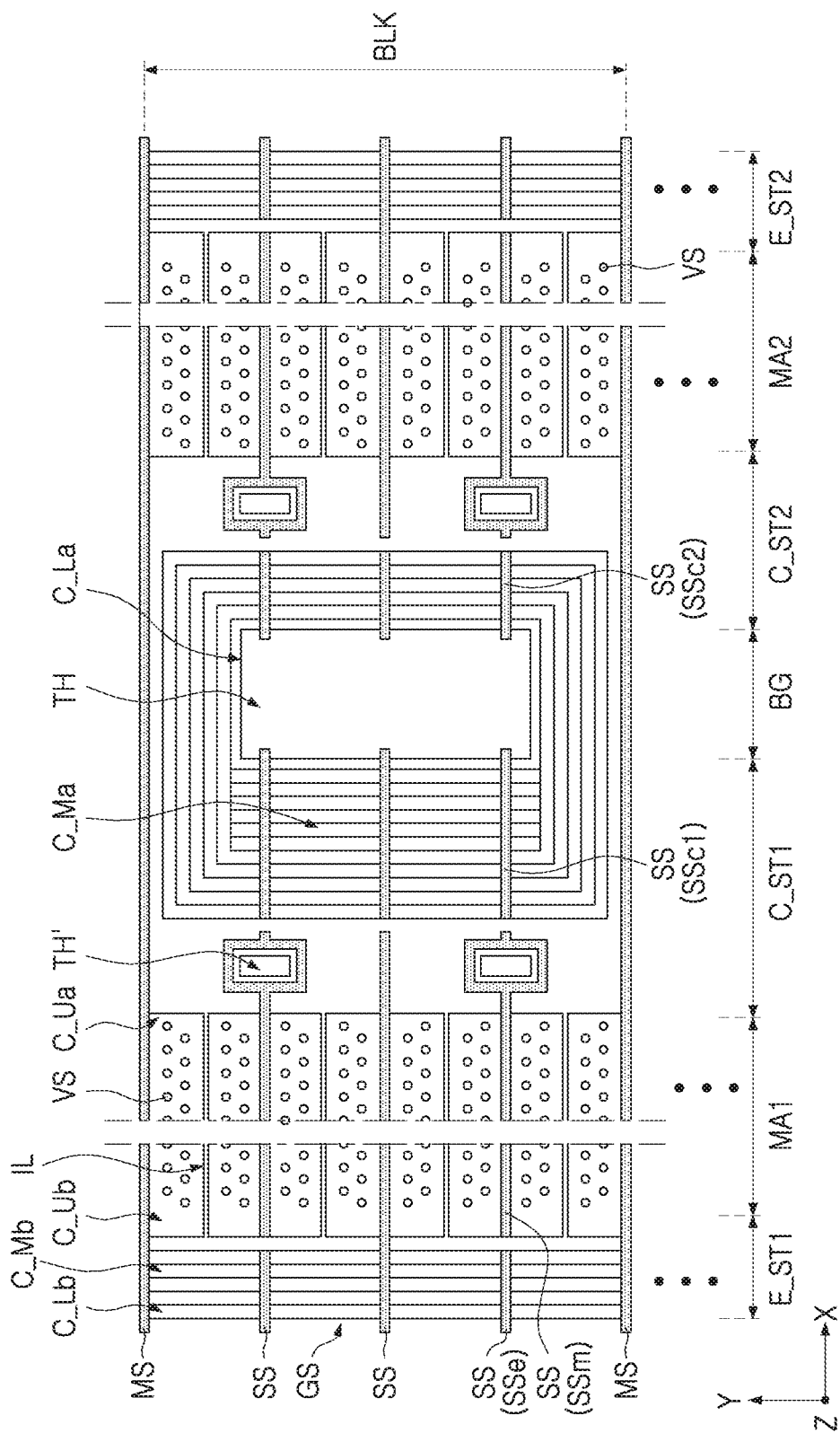
FIGS. 11 to 14 are plan views schematically illustrating a three-dimensional semiconductor memory device, according to an example embodiment.

Referring to FIG. 11, a three-dimensional semiconductor memory device of this embodiment may include three auxiliary separation structures SS between a pair of main separation structures MS. For example, three auxiliary separation structures SS may be disposed in one memory block BLK. A size of each memory block BLK may be increased, and each memory block BLK may include more memory cells, as compared to the three-dimensional semiconductor memory device of FIGS. 3 to 6. For example, when increasing the number of auxiliary separation structures SS disposed in one memory block BLK from one to three, the number of memory cells in the memory block BLK may be doubled.

Portions of the memory separation portions SSm adjacent to the main separation structure MS may surround the auxiliary through regions TH' in the first and second directions (the X and Y directions) and extend lengthwise in the first direction (the X direction) into the first and second inner stepped regions C_ST1 and C_ST2. A portion positioned in a central portion of the memory separation portions SSm may extend linearly into the first and second inner stepped regions C_ST1 and C_ST2.

Between a pair of main separation structures MS adjacent to each other, eight upper gate electrodes G_U separated from each other by three auxiliary separation structures SS arranged between the pair of main separation structures MS in one memory block BLK, and by an insulation line (e.g., insulation line IL in FIG. 6) disposed between adjacent auxiliary separation structures SS and between the auxiliary separation structures SS and the main separation structures MS.

Figure 12:
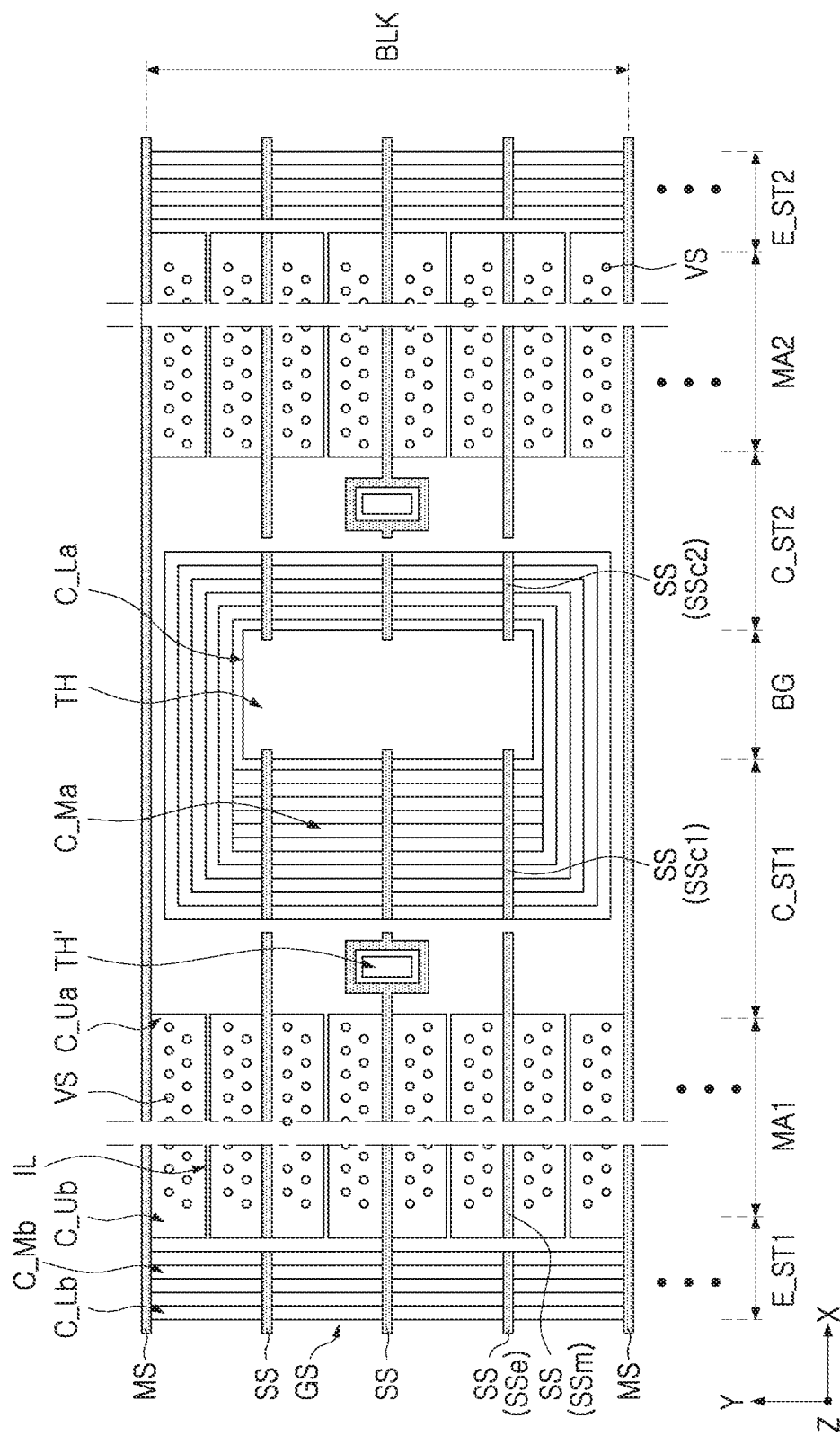

Referring to FIG. 12, portions of memory separation portions SSm adjacent to main separation structure MS may be linearly extended to first and second inner stepped regions C_ST1 and C_ST2. A portion positioned in a central portion of the memory separation portions SSm may surround the auxiliary through regions TH' in the first and second directions (the X and Y directions) and extend lengthwise in the first direction (the X direction) into the first and second inner stepped regions C_ST1 and C_ST2.

Figure 13:
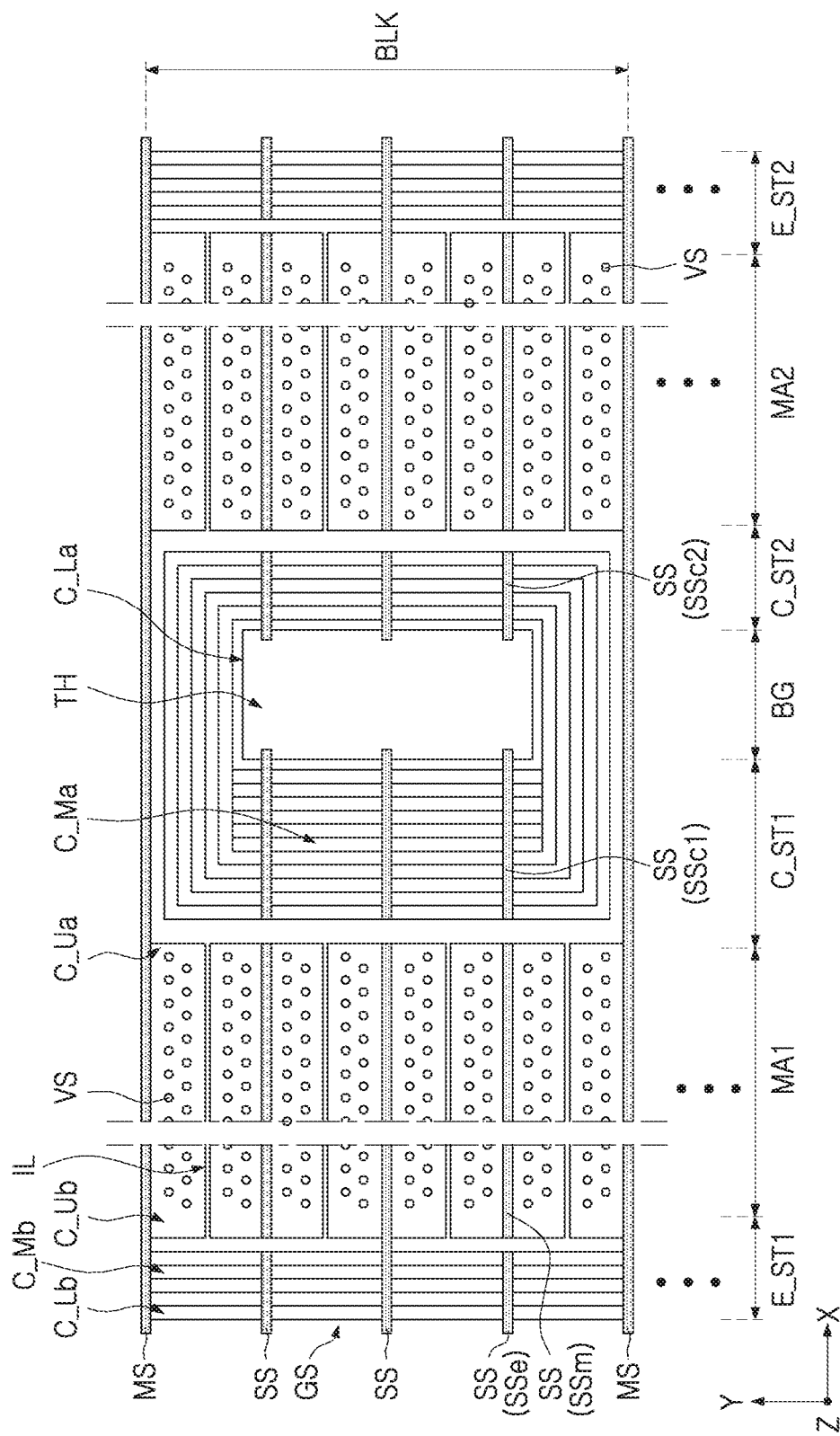

Referring to FIG. 13, in a different manner to FIG. 11, a three-dimensional semiconductor memory device may not include auxiliary through regions TH'. Memory separation portions SSm may extend linearly into first and second inner stepped regions C_ST1 and C_ST2. Widths of the first and second inner stepped regions C_ST1 and C_ST2 in a first direction (an X direction) may be narrower than those of FIG. 11. Widths of the first and second memory cell array regions MA1 and MA2 in the first direction (the X direction) may be wider than those of FIG. 11, and the numbers of vertical channel structures VS disposed in the first and second memory cell array regions MA1 and MA2 may be greater than those of FIG. 11.

Figure 14:
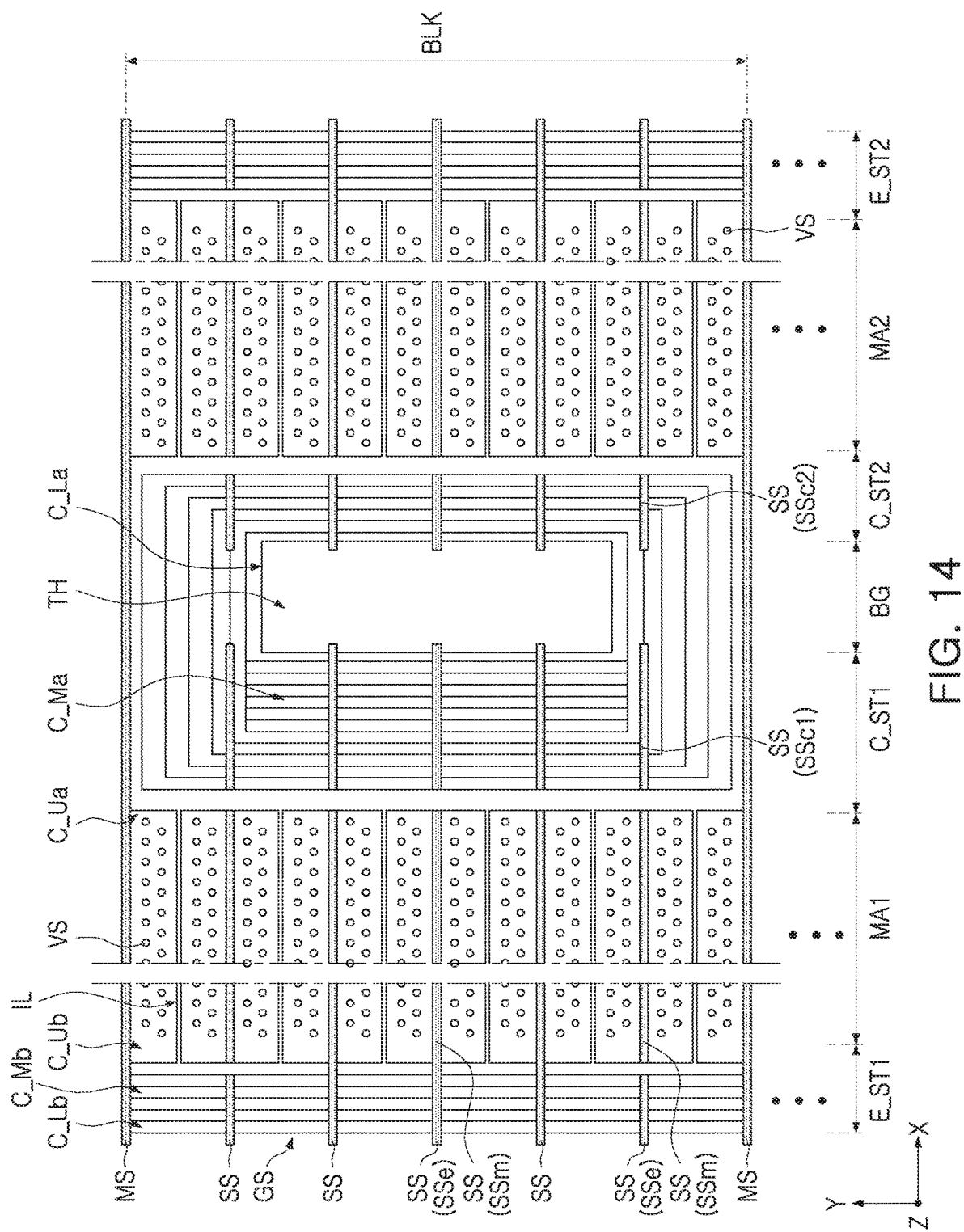

Referring to FIG. 14, a three-dimensional semiconductor memory device of this embodiment may include five auxiliary separation structures SS between a pair of main separation structures MS. For example, five auxiliary separation structures SS may be disposed in one memory block BLK. A size of each memory block BLK may be increased, and each memory block BLK may include more memory cells, as compared to the three-dimensional semiconductor memory device of FIGS. 3 to 6.

Portions of the auxiliary separation structures SS adjacent to the main separation structure MS may be spaced apart from the through region TH in the second direction (the Y direction). For example, middle separation portions SSc1 and SSc2 of the auxiliary separation structures SS adjacent to the main separation structure MS may be disposed a distance away from the through region TH.

Figure 15:
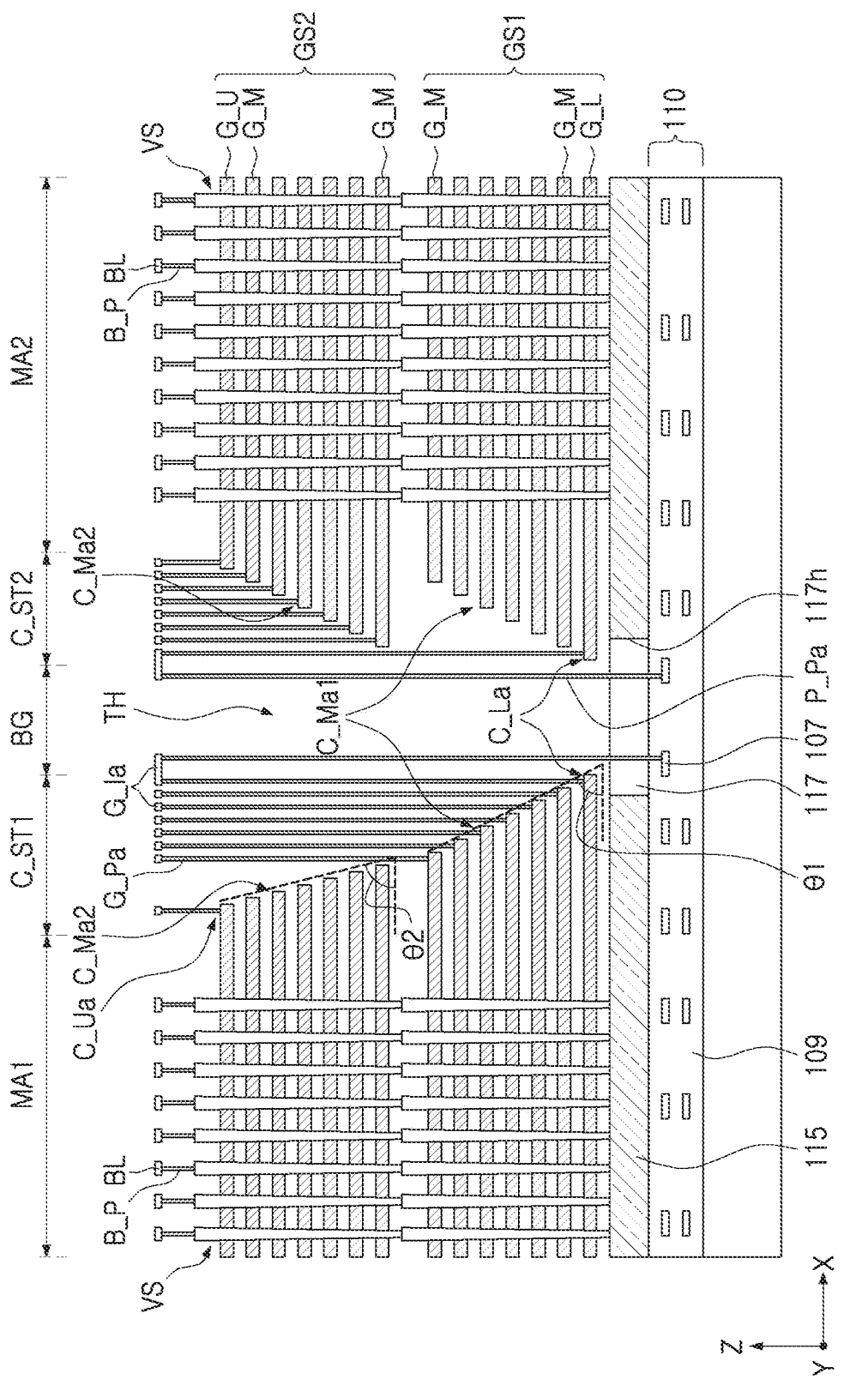
FIG. 15 is a cross-sectional view schematically illustrating a three-dimensional semiconductor memory device, according to an example embodiment.

FIG. 15 is a cross-sectional view schematically illustrating a three-dimensional semiconductor memory device according to an example embodiment.

Referring to FIG. 15, in the first inner stepped region C_ST1, contact pads C_Ua and C_Ma2 of a second gate stacked structure GS2 may form a stepped structure having a second inclined angle θ2, and contact pads C_Ma1 and C_La of a first gate stacked structure GS1 may form a stepped structure having a first inclined angle θ1. The second inclined angle θ2 may be larger than the first inclined angle θ1. The first and second inclined angles θ1 and θ2 may be defined as angles with respect to an upper surface of a base substrate 115.

Accordingly, a width of the first inner stepped region C_ST1 may be narrower than that of FIG. 10.

Figure 16:
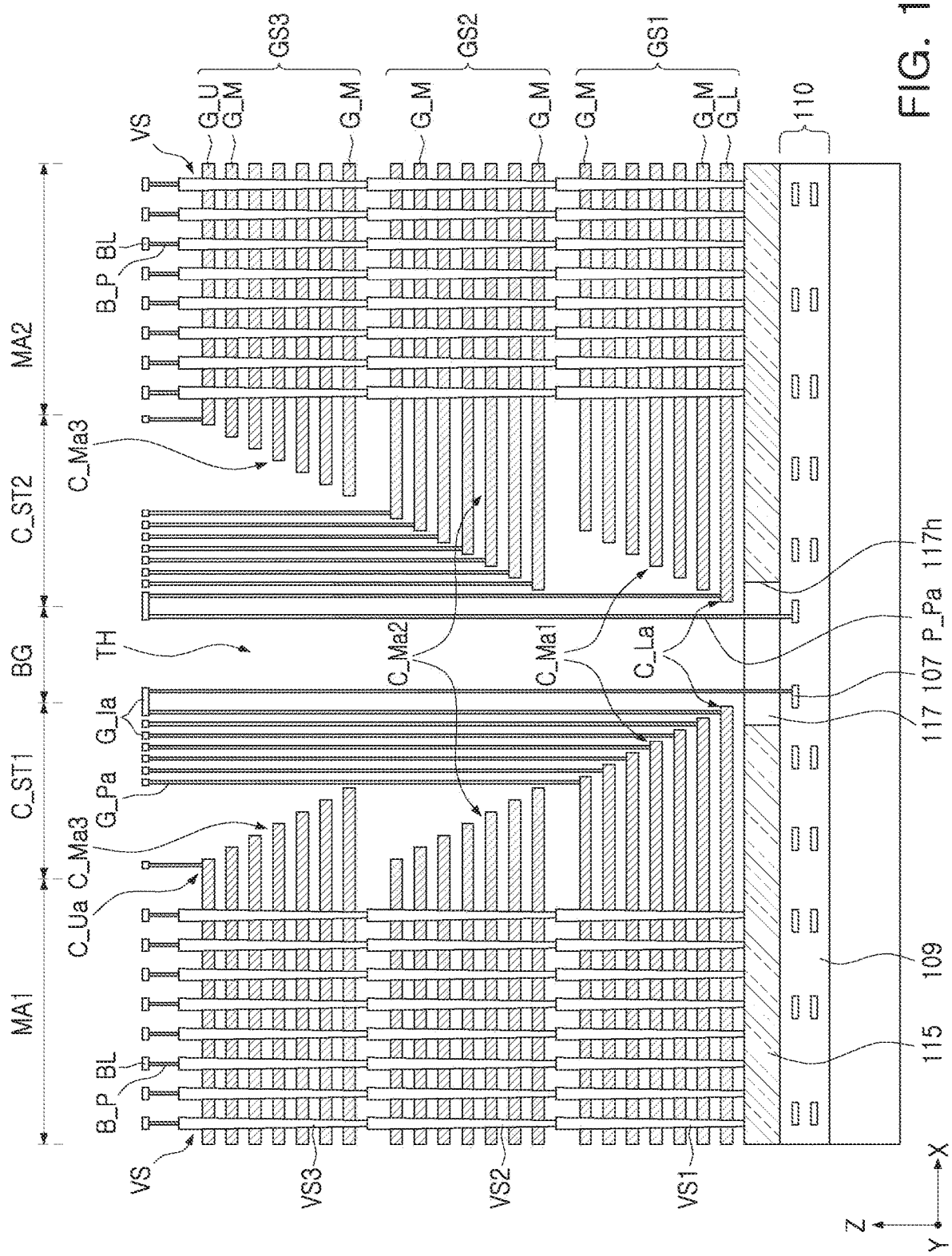
FIG. 16 is a cross-sectional view schematically illustrating a three-dimensional semiconductor memory device, according to an example embodiment.

FIG. 16 is a cross-sectional view schematically illustrating a three-dimensional semiconductor memory device according to an example embodiment.

Referring to FIG. 16, a gate stacked structure GS may include a first gate stacked structure GS1, a second gate stacked structure GS2, and a third gate stacked structure GS3, stacked on a base substrate 115 in sequence. The first gate stacked structure GS1 may include a lower gate electrode G_L and middle gate electrodes G_M, the second gate stacked structure GS2 may include middle gate electrodes G_M, and the third gate stacked structure GS3 may include middle gate electrodes G_M and an upper gate electrode G_U.

Second middle contact pads C_Ma2 of the middle gate electrodes G_M of the second gate stacked structure GS2 may not overlap first middle contact pads C_Ma1 of the middle gate electrodes G_M of the first gate stacked structure GS1 in the first inner stepped region C_ST1, but may overlap the first middle contact pads C_Ma1 only in the second inner stepped region C_ST2. Third middle contact pads C_Ma3 of the middle gate electrodes G_M of the third gate stacked structure GS3 may overlap the second middle contact pads C_Ma2 of the middle gate electrodes G_M of the second gate stacked structure GS2 in the first inner stepped region C_ST1, but may not overlap the second middle contact pads C_Ma2 in the second inner stepped region C_ST2.

In the first inner stepped region C_ST1, the third middle contact pads C_Ma3 of the third gate stacked structure GS3 may overlap the second middle contact pads C_Ma2 of the second gate stacked structure GS2. In the second inner stepped region C_ST2, the second middle contact pads C_Ma2 of the second gate stacked structure GS2 may overlap the first middle contact pads C_Ma1 of the first gate stacked structure GS1.

A portion of the gate contact plugs G_Pa connected to the middle gate electrodes G_M may be formed on the first middle contact pads C_Ma1 of the first gate stacked structure GS1 and on the third middle contact pads C_Ma1 of the first gate stacked structure GS1 in the first inner stepped region C_ST1, and the other portion thereof may be formed on the second middle contact pads C_Ma2 of the second gate stacked structure GS2 in the second inner stepped region C_ST2.

Gate contact plugs G_Pa connected to the upper gate electrode G_U may be formed on inner upper contact pads C_Ua of the first inner stepped region C_ST1 and the second inner stepped region C_ST2, respectively. Gate contact plugs G_Pa connected to the lower gate electrode G_L may be formed on inner lower contact pads C_La of the first inner stepped region C_ST1 and the second inner stepped region C_ST2, respectively.

A vertical channel structure VS may include a first vertical channel structure VS1, a second vertical channel structure VS2, and a third vertical channel structure VS3, which are stacked on a base substrate 115 in sequence. The first vertical channel structure VS1 may pass through the first gate stacked structure GS1, the second vertical channel structure VS2 may pass through the second gate stacked structure GS2, and the third vertical channel structure VS3 may pass through the third gate stacked structure GS3.

Figure 17:
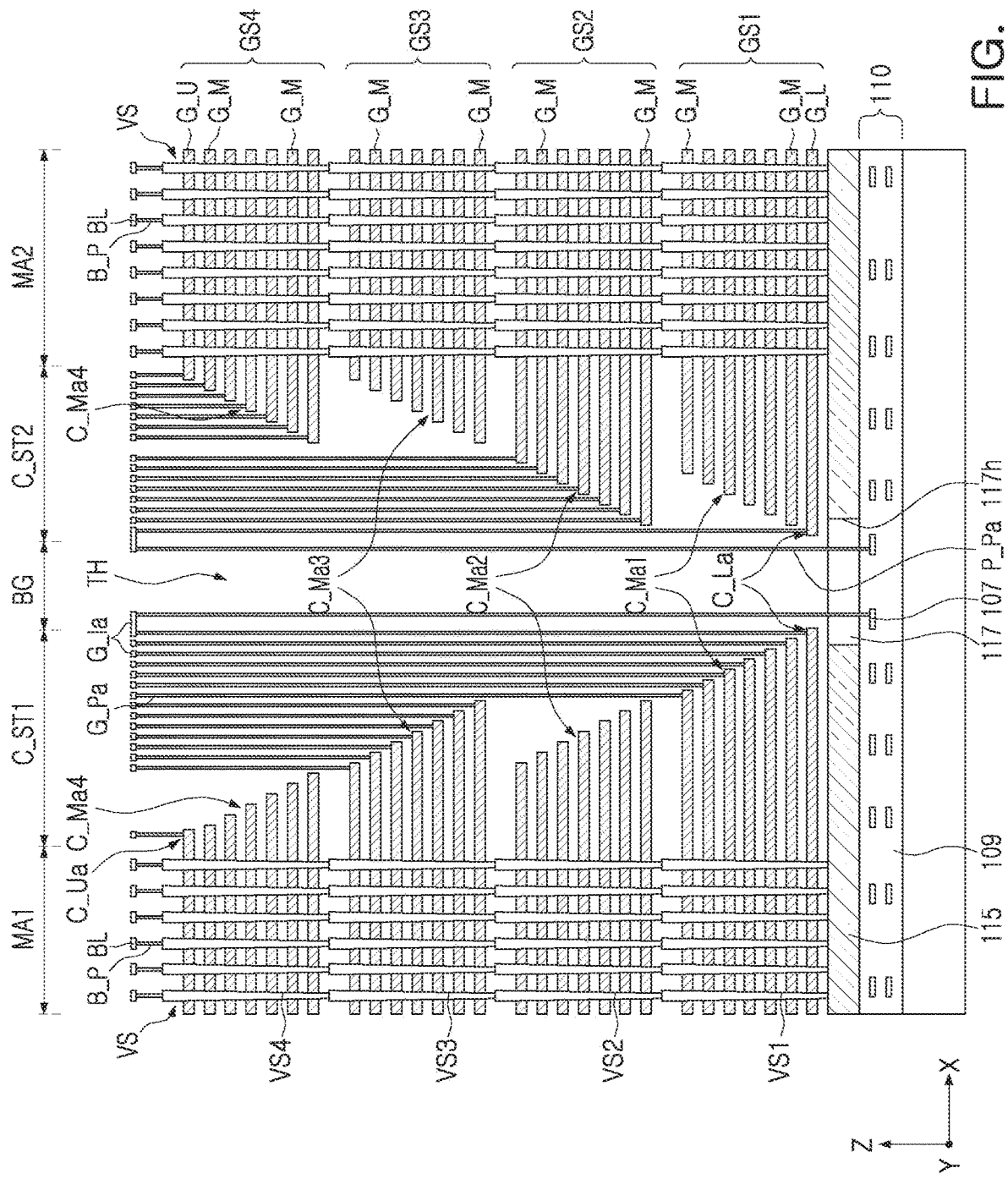
FIG. 17 is a cross-sectional view schematically illustrating a three-dimensional semiconductor, according to an example embodiment.

FIG. 17 is a cross-sectional view schematically illustrating a three-dimensional semiconductor according to an example embodiment.

Referring to FIG. 17, a gate stacked structure GS may include a first gate stacked structure GS1, a second gate stacked structure GS2, a third gate stacked structure GS3, and a fourth gate stacked structure GS4, which are stacked on a base substrate 115 in sequence. The first gate stacked structure GS1 may include a lower gate electrode G_L and middle gate electrodes G_M, the second and third gate stacked structures GS2 and GS3 may include middle gate electrodes G_M, and the fourth gate stacked structure GS4 may include middle gate electrodes G_M and an upper gate electrode G_U.

Second middle contact pads C_Ma2 of the middle gate electrodes G_M of the second gate stacked structure GS2 may not overlap first middle contact pads C_Ma1 of the middle gate electrodes G_M of the first gate stacked structure GS1 in the first inner stepped region C_ST1, but may overlap the first middle contact pads C_Ma1 in the second inner stepped region C_ST2. Third middle contact pads C_Ma3 of the middle gate electrodes G_M of the third gate stacked structure GS3 may overlap the second middle contact pads C_Ma2 of the middle gate electrodes G_M of the second gate stacked structure GS2 in the first inner stepped region C_ST1, but may not overlap the second middle contact pads C_Ma2 in the second inner stepped region C_ST2. Fourth middle contact pads C_Ma4 of the middle gate electrodes G_M of the fourth gate stacked structure GS4 may not overlap the third middle contact pads C_Ma3 of the middle gate electrodes G_M of the third gate stacked structure GS3 in the first inner stepped region C_ST1, but may overlap the third middle contact pads C_Ma3 in the second inner stepped region C_ST2.

In the first inner stepped region C_ST1, the third middle contact pads C_Ma3 of the third gate stacked structure GS3 may overlap the second middle contact pads C_Ma3 of the second gate stacked structure GS2. In the second inner stepped region C_ST2, the second middle contact pads C_Ma2 of the second gate stacked structure GS2 may overlap the first middle contact pads C_Ma1 of the first gate stacked structure GS1, and the fourth middle contact pads C_Ma4 of the fourth gate stacked structure GS4 may overlap the third contact pads C_Ma3 of the third gate stacked structure GS3.

A portion of the gate contact plugs G_Pa connected to the middle gate electrodes G_M may be formed on the first middle contact pads C_Ma1 of the first gate stacked structure GS1 and on the third middle contact pads C_Ma3 of the third gate stacked structure GS3 in the first inner stepped region C_ST1, and the other portion thereof may be formed on the second middle contact pads C_Ma2 of the second gate stacked structure GS2 and on the fourth middle contact pads C_Ma4 of the fourth gate stacked structure GS4 in the second inner stepped region C_ST2.

Gate contact plugs G_Pa connected to the upper gate electrode G_U may be formed on inner upper contact pads C_Ua in the first inner stepped region C_ST1 and the second inner stepped region C_ST2, respectively. Gate contact plugs G_Pa connected to the lower gate electrode G_L may be formed on inner lower contact pads C_La in the first inner stepped region C_ST1 and the second inner stepped region C_ST2, respectively.

A vertical channel structure VS may include a first vertical channel structure VS1, a second vertical channel structure VS2, a third vertical channel structure VS3, and a fourth vertical channel structure VS3, which are stacked on a base substrate 115 in sequence. The first vertical channel structure VS1 may pass through the first gate stacked structure GS1, the second vertical channel structure VS2 may pass through the second gate stacked structure GS2, the third vertical channel structure VS3 may pass through the third gate stacked structure GS3, and the fourth vertical channel structure VS4 may pass through the fourth gate stacked structure GS4.

According to example embodiments, memory cell array regions spaced apart from each other may share gate electrodes, and may provide gate contact pads between memory cell array regions.

According to example embodiments, an area occupied by gate contact pads, which may be used to connect gate electrodes to peripheral circuits, may be reduced. Therefore, the degree of integration of the three-dimensional semiconductor memory device may be improved.

While example embodiments have been illustrated and described above, it will be apparent to those skilled in the art that modifications and variations could be made without departing from the scope of the present inventive concept as defined by the appended claims.

What is claimed is:
1. A three-dimensional semiconductor memory device comprising:
   first and second gate stacked structures, disposed on a base substrate, and stacked in a vertical direction perpendicular to a surface of the base substrate, the first and second gate stacked structures including first and second gate electrodes, respectively, spaced apart from each other and stacked in the vertical direction;
   a through region passing through the first and second gate stacked structures and surrounded by the first and second gate stacked structures;
   vertical channel structures passing through the first and second gate stacked structures; and
   first and second gate contact plugs connected to the first and second gate electrodes, respectively,
   wherein the first gate stacked structure includes a first step region having a first stepped shape such that steps of the first gate electrodes lower in a first direction toward the through region and a second step region having a second stepped shape such that steps of the first gate electrodes lower in a second direction toward the through region,
   wherein the first direction and the second direction are parallel to the surface of the base substrate and are different each other,
   wherein the second gate stacked structure includes a third step region having a third stepped shape such that steps of the second gate electrodes lower in the first direction toward the through region and a fourth step region having a fourth stepped shape such that steps of the second gate electrodes lower in the second direction toward the through region,
   wherein the first gate contact plugs are connected to first contact pads of the first gate electrodes of any one region of the first and second step regions, and
   wherein the second gate contact plugs are connected to second contact pads of the second gate electrodes of any one region of the third and fourth step regions.

2. The three-dimensional semiconductor memory device according to claim 1, further comprising:
   a third gate stacked structure disposed on the second gate stacked structure and including third gate electrodes spaced apart from each other and stacked in the vertical direction; and
   third gate contact plugs connected to third gate electrodes,
   wherein the third gate stacked structure includes a fifth step region having a fifth stepped shape such that steps of the third gate electrodes lower in the first direction toward the through region and a sixth step region having a sixth stepped shape such that steps of the third gate electrodes lower in the second direction toward the through region, and
   wherein the third gate contact plugs are connected to third contact pads of the third gate electrodes of any one region of the fifth and sixth step regions.

3. The three-dimensional semiconductor memory device according to claim 1, further comprising:

main separation structures passing through the first and second gate stacked structures and extending in the first direction, wherein the through region is disposed between the main separation structures.

4. The three-dimensional semiconductor memory device according to claim 3, further comprising:

an auxiliary separation structure disposed between the main separation structures and having portions spaced apart in the first direction, wherein a portion of the auxiliary separation structure passes through the first and second contact pads.

5. The three-dimensional semiconductor memory device according to claim 1, wherein the vertical channel structures include a first vertical channel structure passing through the first gate stacked structure and a second vertical channel structure passing through the second gate stacked structure, and wherein the first and second vertical channel structures each include a channel semiconductor layer.

6. The three-dimensional semiconductor memory device according to claim 1, further comprising:

peripheral contact plugs passing through the through region and electrically connected to peripheral circuits disposed in a region lower than the base substrate; and connection wirings for electrically connecting the gate contact plugs and the peripheral contact plugs.

7. The three-dimensional semiconductor memory device according to claim 1, wherein the steps of the second gate electrodes of the third step region non-overlaps the steps of the first electrodes of the first step region in the vertical direction, and wherein the steps of the second gate electrodes of the fourth step region overlaps the steps of the first gate electrodes of the second step region in the vertical direction.

8. A three-dimensional semiconductor memory device comprising:

memory cell array regions disposed on a base substrate;

first and second inner stepped regions between the memory cell array regions;

a bridge region between the first and second inner stepped regions;

a gate stacked structure including first word lines and second word lines stacked in the memory cell array regions and extending lengthwise in a first direction to the first and second inner stepped regions, respectively; and a through region passing through the gate stacked structure in the bridge region;

first gate contact plugs disposed in the first inner stepped region and connected to the first word lines; and second gate contact plugs disposed in the second inner stepped region and connected to the second word lines, wherein each of the first and second word lines extend lengthwise from the memory cell array regions and connect in the bridge region, wherein a length in the first direction of a lowermost word line of the first word lines of the gate stacked structure disposed in the first inner stepped region is different from a length in the first direction of a lowermost word line of the second word lines of the gate stacked structure disposed in the second inner stepped region, and wherein a height of the first gate contact plug having a smallest height among the first gate contact plugs is greater than a height of the second gate contact plug having a smallest height among the second gate contact plugs.

9. The three-dimensional semiconductor memory device according to claim 8, wherein the gate stacked structure includes a first gate stacked structure and a second gate stacked structure stacked on the base substrate, wherein the first word lines of the first gate stacked structure provide first contact pads arranged in a first stepped shape in the first and second inner stepped regions, and the second word lines of the second gate stacked structure provide second contact pads arranged in a second stepped shape in the second inner stepped region, and wherein the second contact pads in the first inner stepped region are spaced apart from the first contact pads in the first direction, and the second contact pads in the second inner stepped region overlap the first contact pads, when viewed in a plan view.

10. The three-dimensional semiconductor memory device according to claim 9, further comprising:

a lower substrate disposed below the base substrate;

a lower structure disposed between the lower substrate and the base substrate and including a peripheral circuit; and a gap fill insulation layer passing through the base substrate, wherein the gap fill insulation layer overlaps the through region, when viewed in a plan view.

11. The three-dimensional semiconductor memory device according to claim 10, further comprising:

one or more peripheral contact plugs passing through the through region and the gap fill insulation layer and electrically connected to the peripheral circuit; and one or more connection wirings electrically connecting the first and second gate contact plugs and the one or more peripheral contact plugs.

12. The three-dimensional semiconductor memory device according to claim 9, wherein the first and second contact pads are arranged in a stepped shape that lowers to the base substrate in a direction toward the through region.

13. The three-dimensional semiconductor memory device according to claim 9, further comprising:

vertical channel structures passing through the gate stacked structure in the memory cell array regions, wherein the vertical channel structures include a first vertical channel structure passing through the first gate stacked structure and a second vertical channel structure passing through the second gate stacked structure, and wherein an upper end of the first vertical channel structure is in contact with a lower end of the second vertical channel structure.

14. The three-dimensional semiconductor memory device according to claim 8, wherein on the same plane, the through region is surrounded by a single word line.

15. The three-dimensional semiconductor memory device according to claim 8, wherein the gate stacked structure further comprises upper selection lines on the second word lines, and wherein the upper selection lines are disposed within the memory cell array regions, respectively, and are spaced apart from each other in the inner stepped region.

16. The three-dimensional semiconductor memory device according to claim 8, wherein a length in the first direction of a lowermost word line of the second word lines of the gate stacked structure disposed in the second inner stepped region is greater than a length in the first direction of an uppermost word line of the first word lines of the gate stacked structure disposed in the second inner stepped region.

17. A three-dimensional semiconductor memory device comprising:
    first and second gate stacked structures stacked on a base substrate;
    a through region passing through the first and second gate stacked structures and surrounded by the first and second gate stacked structures; and
    first and second gate contact plugs connected to the first and second gate stacked structures, respectively,
    wherein the first and second gate stacked structures comprise first and second word lines, respectively,
    wherein the first word lines of the first gate stacked structure include a first step region including first pads surrounding the through region and disposed in a first stepped shape that lowers toward the through region and a second step region including second pads surrounding the through region and disposed in a second stepped shape that lowers toward the through region,
    wherein the second word lines of the second gate stacked structure include a third step region including pads surrounding the through region and disposed in a third stepped shape that lowers toward the through region and a fourth step region including fourth pads surrounding the through region and disposed in a fourth stepped shape that lowers toward the through region,
    wherein the first gate contact plugs are disposed directly above the first step region on one side of the through region so that the first gate contact plugs are connected to the first word lines, respectively, and
    wherein the second gate contact plugs are disposed directly above the third step region on the other side of the through region so that the second gate contact plugs are connected to second word lines, respectively.

18. The three-dimensional semiconductor memory device according to claim 17, further comprising:
    main separation structures passing through the first and second gate stacked structures and extending lengthwise in a first direction parallel to a surface of the base substrate; and
    auxiliary separation structures disposed between the main separation structures and spaced apart from one another in a second direction perpendicular to the first direction and parallel to the surface of the base substrate,
    wherein the through region is disposed between the main separation structures, and
    wherein a portion of the auxiliary separation structures pass through the first and third pads.

19. The three-dimensional semiconductor memory device according to claim 17, further comprising:
    a lower substrate disposed below the base substrate;
    a lower structure disposed between the lower substrate and the base substrate and including a peripheral circuit;
    a gap fill insulation layer passing through the base substrate and overlapping the through region;
    a peripheral contact plug passing through the through region and the gap fill insulation layer and electrically connected to the peripheral circuit; and
    a gate connection wiring electrically connecting the peripheral contact plug and the first and second gate contact plugs.

20. The three-dimensional semiconductor memory device according to claim 17, further comprising:
    vertical channel structures passing through the first and second gate stacked structures,
    wherein the vertical channel structures comprise a gate dielectric extending lengthwise in a direction perpendicular to a surface of the base substrate, and a channel semiconductor layer extending lengthwise in the direction perpendicular to the surface of the base substrate and disposed between the first and second gate stacked structures and the gate dielectric.

* * * * *